(12) United States Patent
Watanabe et al.

(10) Patent No.: US 7,692,315 B2
(45) Date of Patent: Apr. 6, 2010

(54) SEMICONDUCTOR DEVICE AND METHOD FOR MANUFACTURING THE SAME

(75) Inventors: Kenichi Watanabe, Kawasaki (JP); Masanobu Ikeda, Ebina (JP); Takahiro Kimura, Kawasaki (JP)

(73) Assignee: Fujitsu Microelectronics Limited, Yokohama (JP)

( * ) Notice: Subject to any disclaimer, the term of this patent is extended or adjusted under 35 U.S.C. 154(b) by 0 days.

(21) Appl. No.: 11/055,652

(22) Filed: Feb. 11, 2005

(65) Prior Publication Data

US 2005/0146041 A1 Jul. 7, 2005

Related U.S. Application Data

(63) Continuation of application No. PCT/JP03/09799, filed on Aug. 1, 2003.

(30) Foreign Application Priority Data

Aug. 30, 2002 (JP) .............................. 2002-256152

(51) Int. Cl.
*H01L 23/52* (2006.01)
*H01L 23/48* (2006.01)
*H01L 29/40* (2006.01)

(52) U.S. Cl. ................. 257/781; 257/E23.02; 257/758; 257/784; 257/786; 438/612

(58) Field of Classification Search .......... 257/E21.508, 257/E21.576, E21.584, E23.02, 758, 784, 257/786, 737, 781; 438/612
See application file for complete search history.

(56) References Cited

U.S. PATENT DOCUMENTS

| | | | |
|---|---|---|---|
| 5,723,822 A * | 3/1998 | Lien | ............................ 174/250 |
| 5,731,620 A * | 3/1998 | Mori | ............................ 257/386 |
| 5,847,466 A | 12/1998 | Ito et al. | |
| 6,100,589 A | 8/2000 | Tanaka | |
| 6,103,617 A * | 8/2000 | Yoon et al. | .................. 438/624 |
| 6,143,396 A | 11/2000 | Saran et al. | |
| 6,163,075 A | 12/2000 | Okushima | |
| 6,198,170 B1 | 3/2001 | Zhao | |

(Continued)

FOREIGN PATENT DOCUMENTS

GB  2364 170  1/2002

(Continued)

OTHER PUBLICATIONS

Mark Oneill et al., "Low-k Materials by Design", Semiconductor International, Jun. 1, 2002.

(Continued)

*Primary Examiner*—Chris C Chu
(74) *Attorney, Agent, or Firm*—Westerman, Hattori, Daniels & Adrian, LLP

(57) ABSTRACT

In a pad forming region electrically connecting an element forming region to the outside, in which a low dielectric constant insulating film is formed in association with in the element forming region, a Cu film serving as a via formed in the low dielectric constant insulating film in the pad forming region is disposed in higher density than that of a Cu film serving as a via in the element forming region. Hereby, when an internal stress occurs, the stress is prevented from disproportionately concentrating on the via, and deterioration of a function of a wiring caused thereby can be avoided.

21 Claims, 35 Drawing Sheets

U.S. PATENT DOCUMENTS

| | | | |
|---|---|---|---|
| 6,214,630 B1 * | 4/2001 | Hsuan et al. | 438/11 |
| 6,246,118 B1 | 6/2001 | Buynoski | |
| 6,297,563 B1 | 10/2001 | Yamaha | |
| 6,313,540 B1 * | 11/2001 | Kida et al. | 257/784 |
| 6,362,528 B2 | 3/2002 | Anand | |
| 6,368,957 B1 * | 4/2002 | Horio | 438/634 |
| 6,407,453 B1 * | 6/2002 | Watanabe et al. | 257/758 |
| 6,417,575 B2 * | 7/2002 | Harada et al. | 257/784 |
| 6,500,748 B2 | 12/2002 | Anand | |
| 6,566,758 B1 * | 5/2003 | Trivedi et al. | 257/774 |
| 6,720,658 B2 | 4/2004 | Anand | |
| 2001/0005046 A1 * | 6/2001 | Hsuan et al. | 257/686 |
| 2001/0013657 A1 | 8/2001 | Anand | |
| 2002/0020918 A1 | 2/2002 | Anand | |
| 2003/0062625 A1 | 4/2003 | Anand | |

FOREIGN PATENT DOCUMENTS

| | | |
|---|---|---|
| JP | 8-45933 | 2/1996 |
| JP | 11-340319 A | 12/1999 |
| JP | 2000-195866 | 7/2000 |
| JP | 2000-195896 A | 7/2000 |
| JP | 2001-85465 | 3/2001 |
| JP | 2001-267323 | 9/2001 |
| JP | 2001-358169 | 12/2001 |
| JP | 10-64938 A | 3/2006 |
| WO | 02/43144 A1 | 5/2002 |

OTHER PUBLICATIONS

J.B. Vella et al. "Mechanical Properties and Porosity of Organo-Silicate Glass (OSG) Low-k Dielectric Films", Mat. Res. Soc. Symp. Proc. vol. 695, 2002, Materials Research Society, pp. L6.25.1, XP008111144.

Japanese Office Action dated Sep. 1, 2009, issued in corresponding Japanese Application No. 2002-256152.

European Office Action dated Sep. 4, 2009, issued in corresponding European Application No. 03 794 073.1-1235.

* cited by examiner

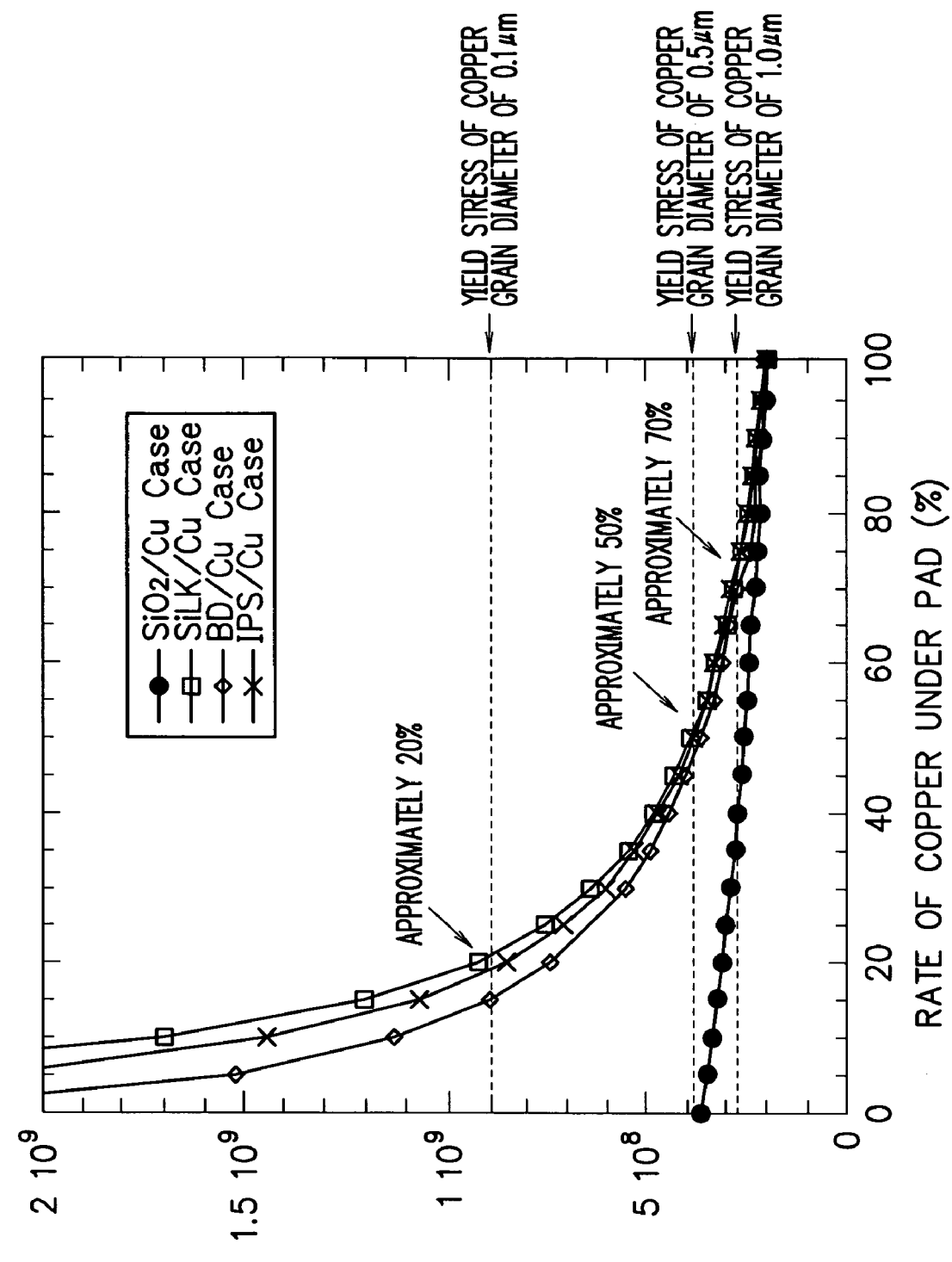
F I G. 1

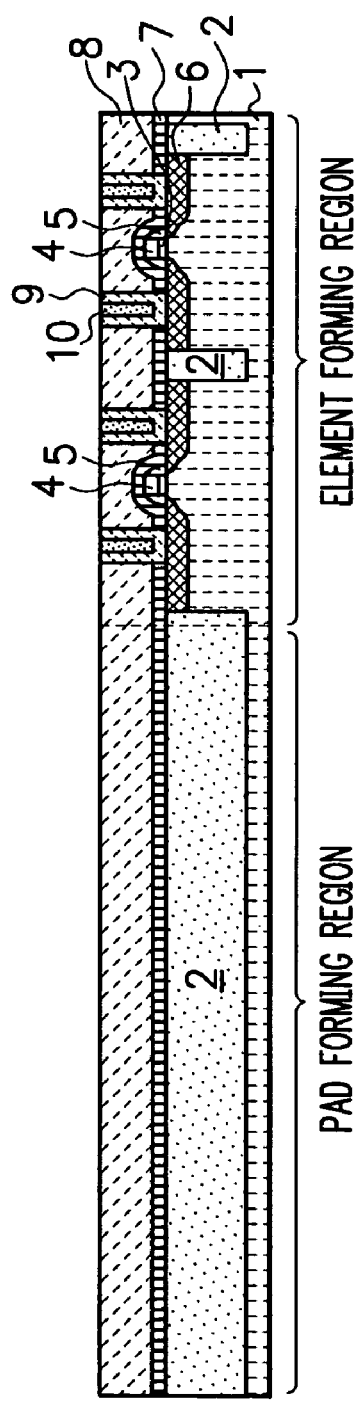
F I G. 3A
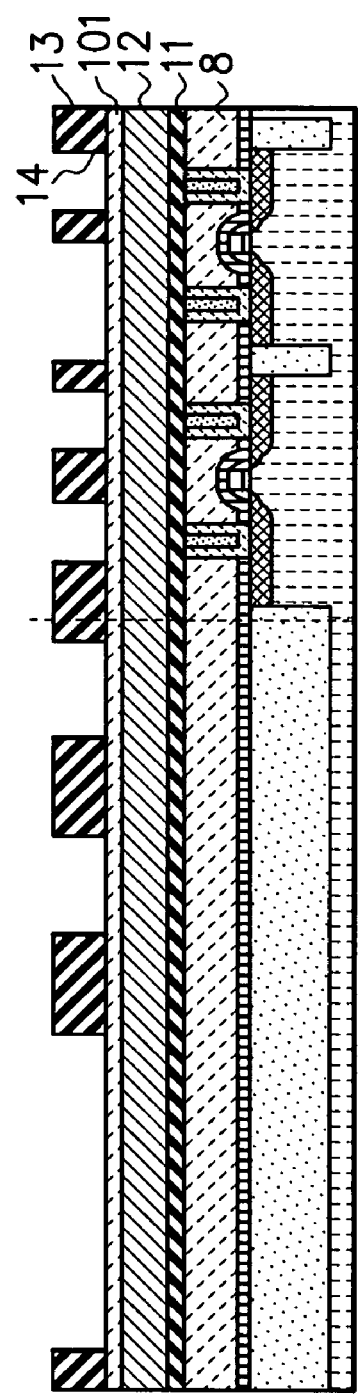
F I G. 3B

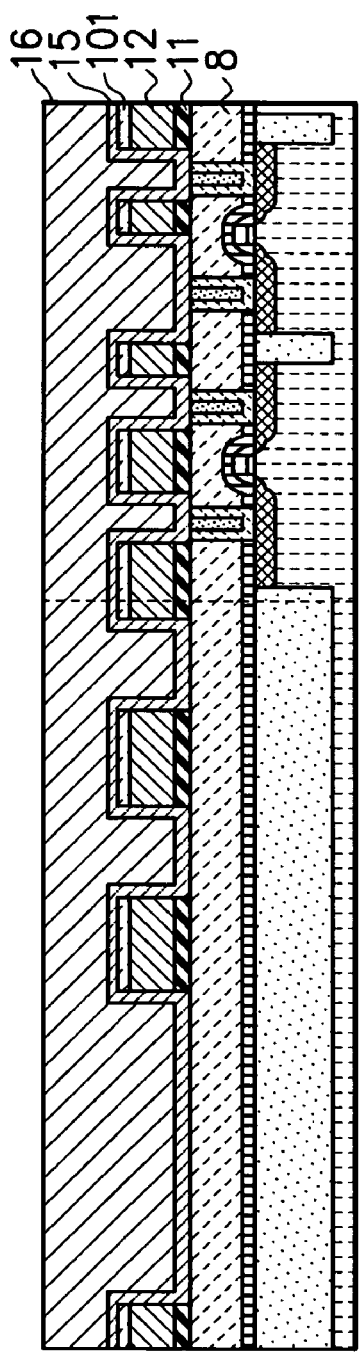
F I G. 4A
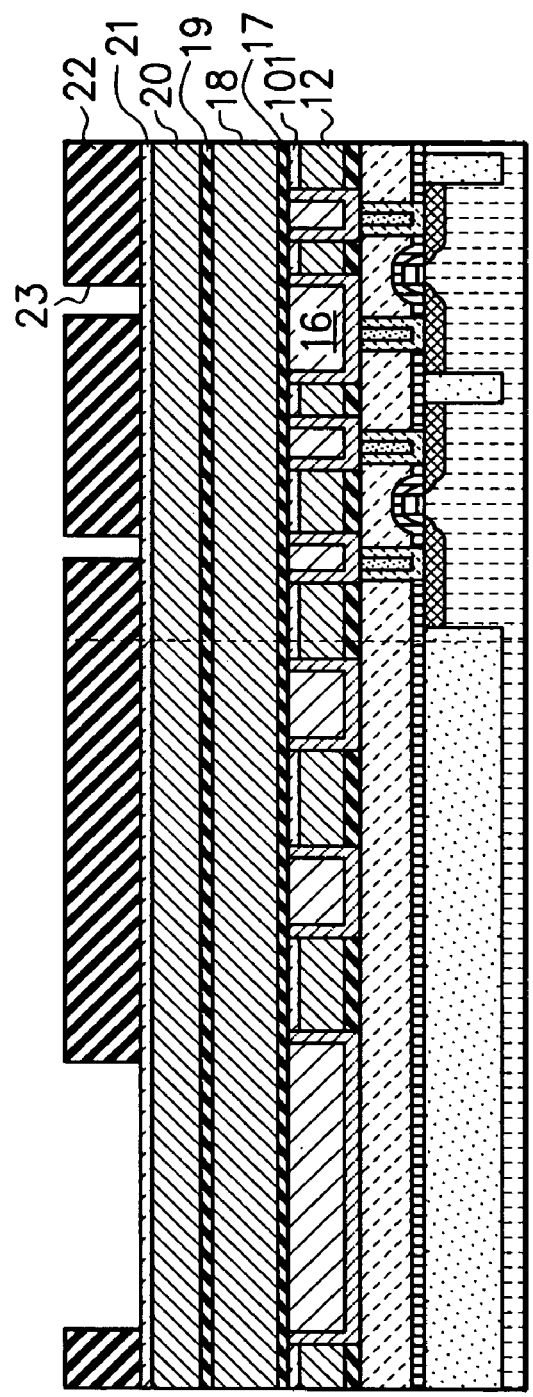
F I G. 4B

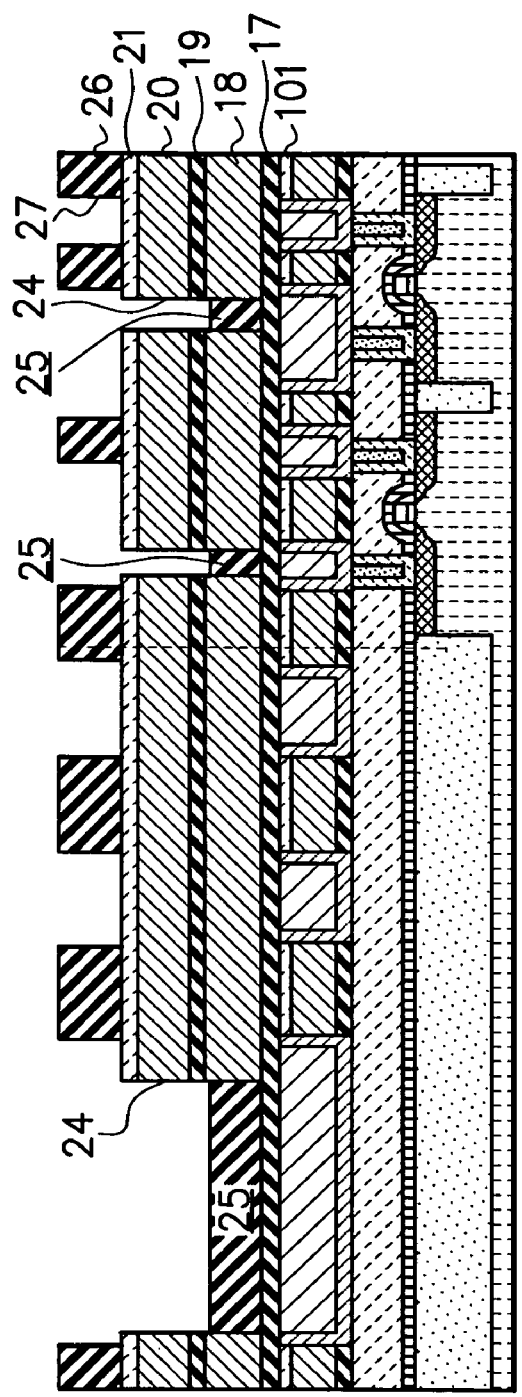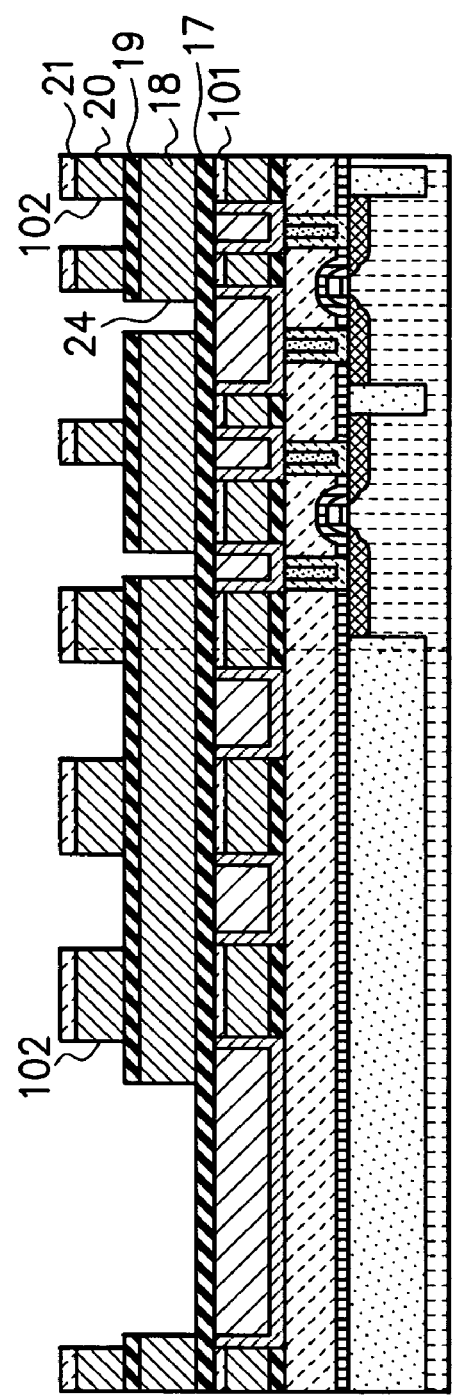
F I G. 5A
F I G. 5B

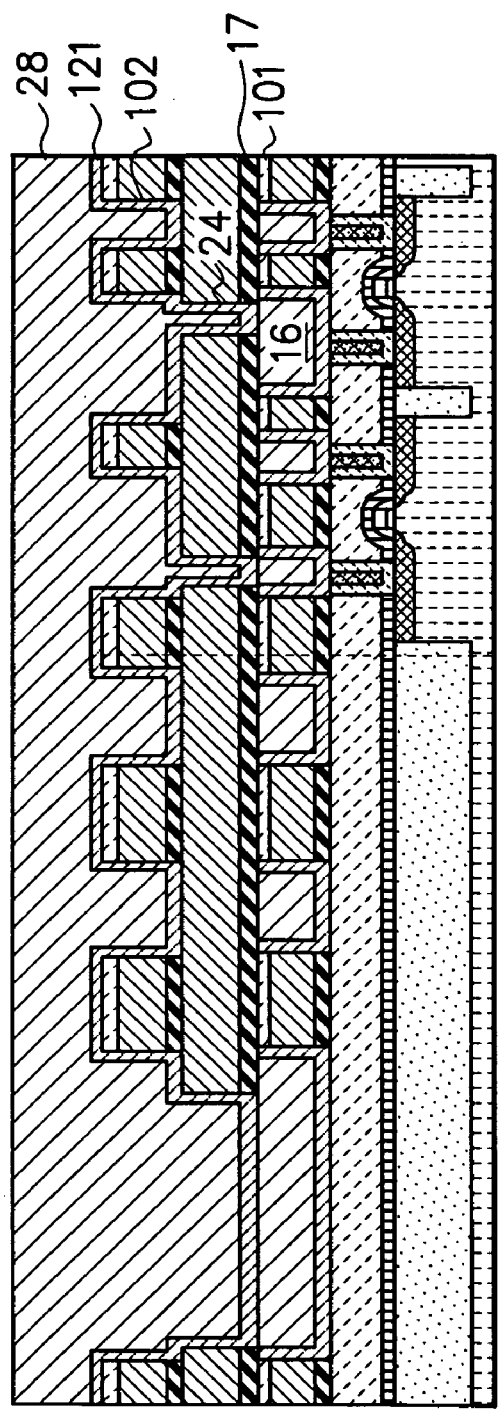
F I G. 6A
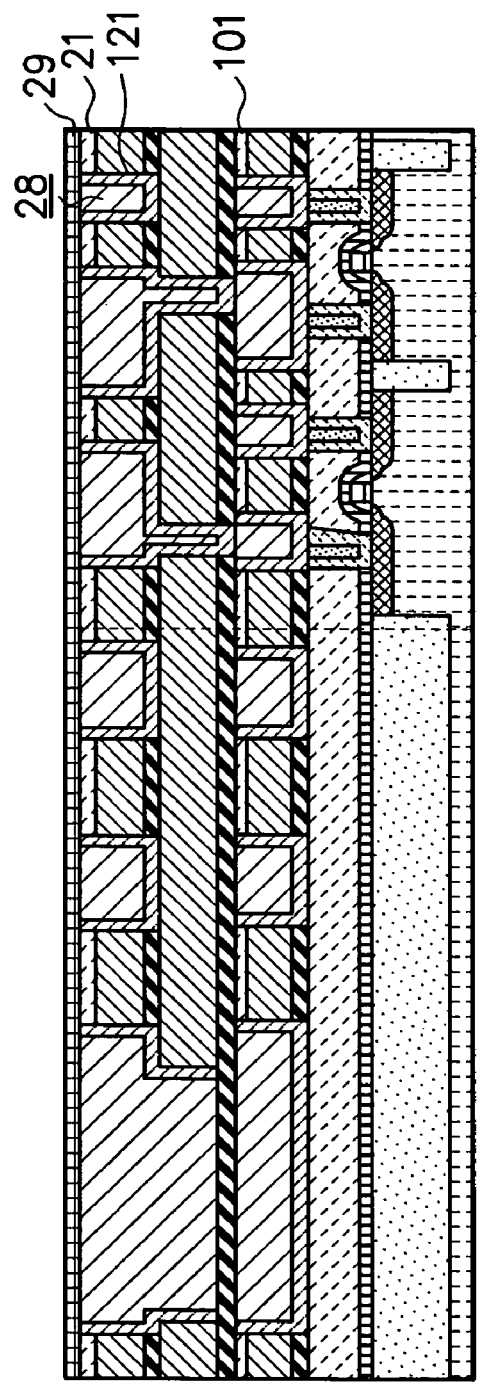
F I G. 6B

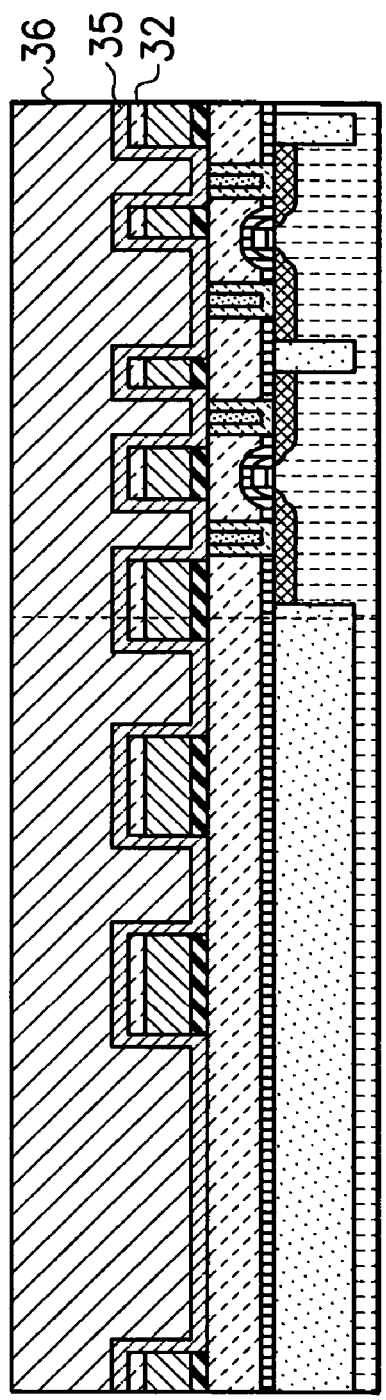
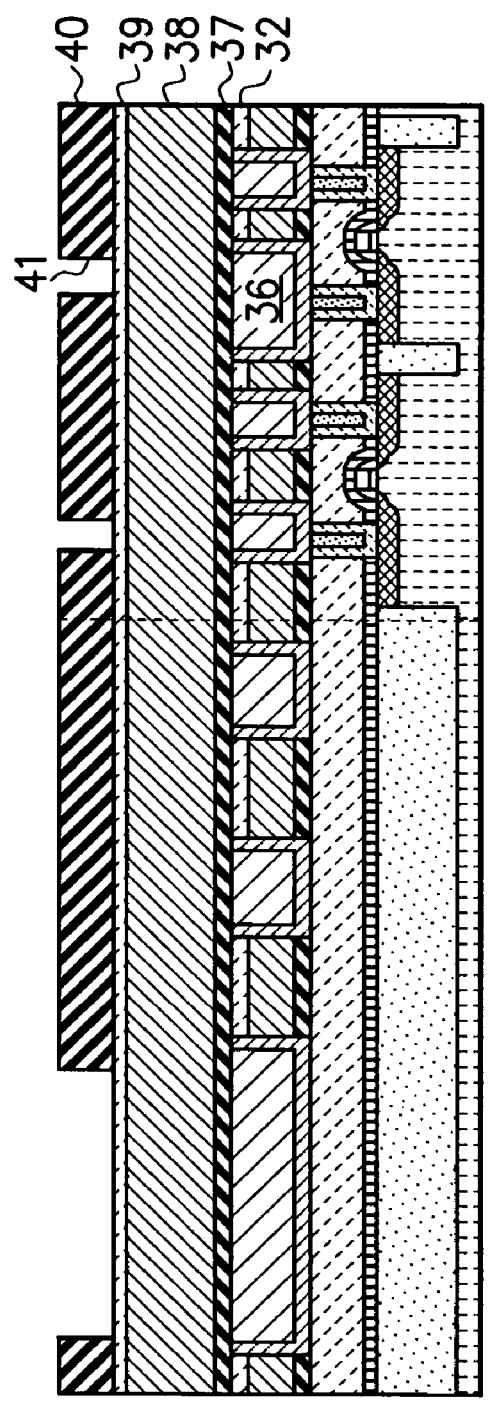
F I G. 8A
F I G. 8B

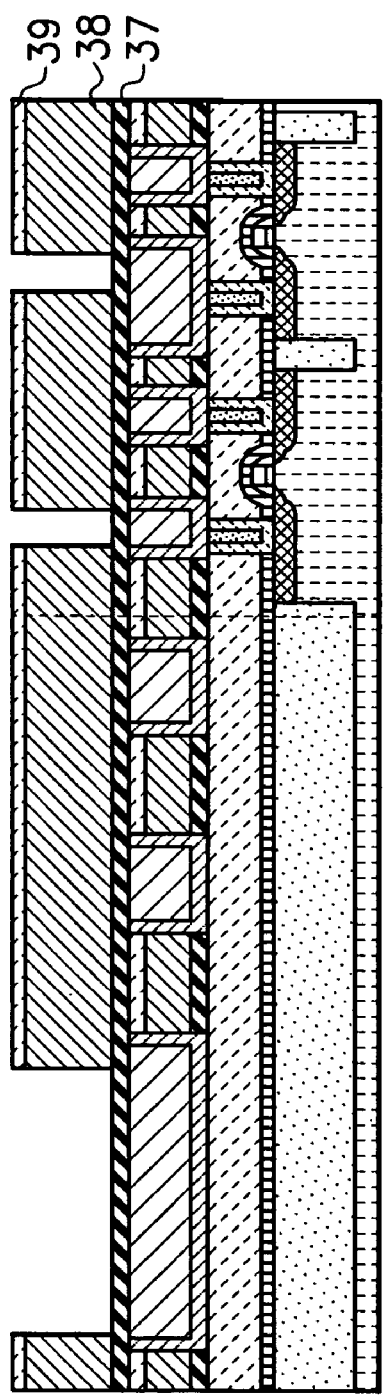
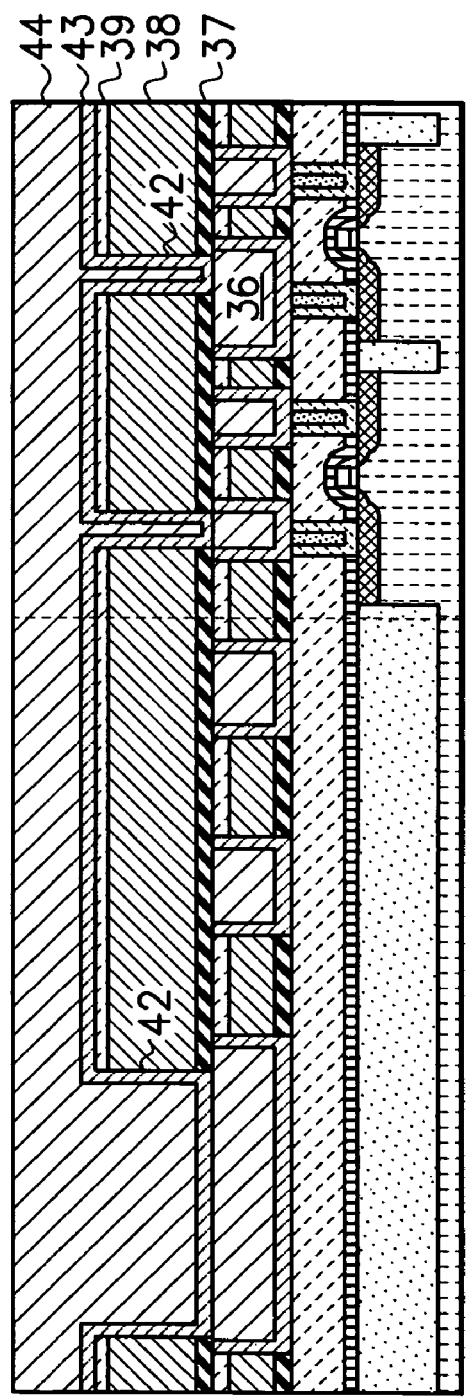
FIG. 9A
FIG. 9B

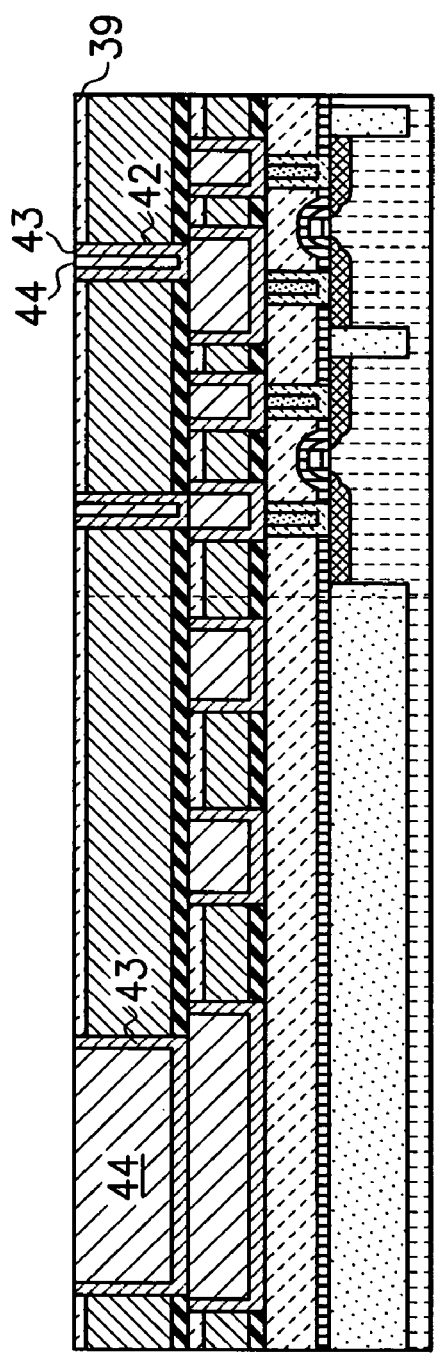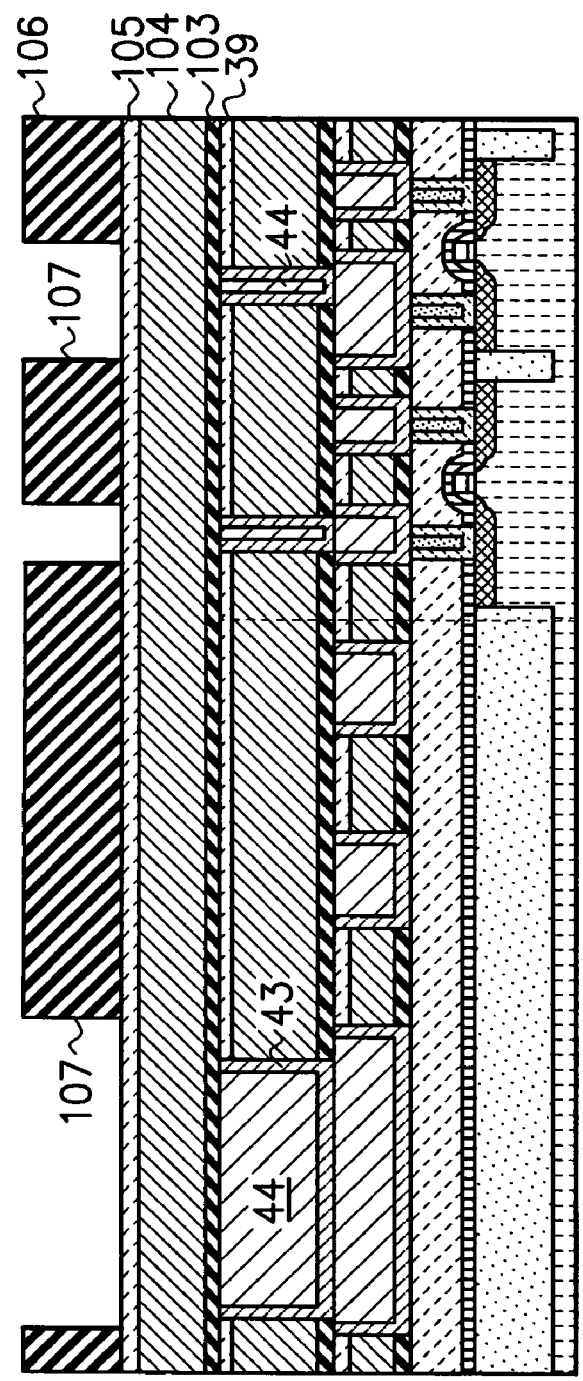
FIG. 10A
FIG. 10B

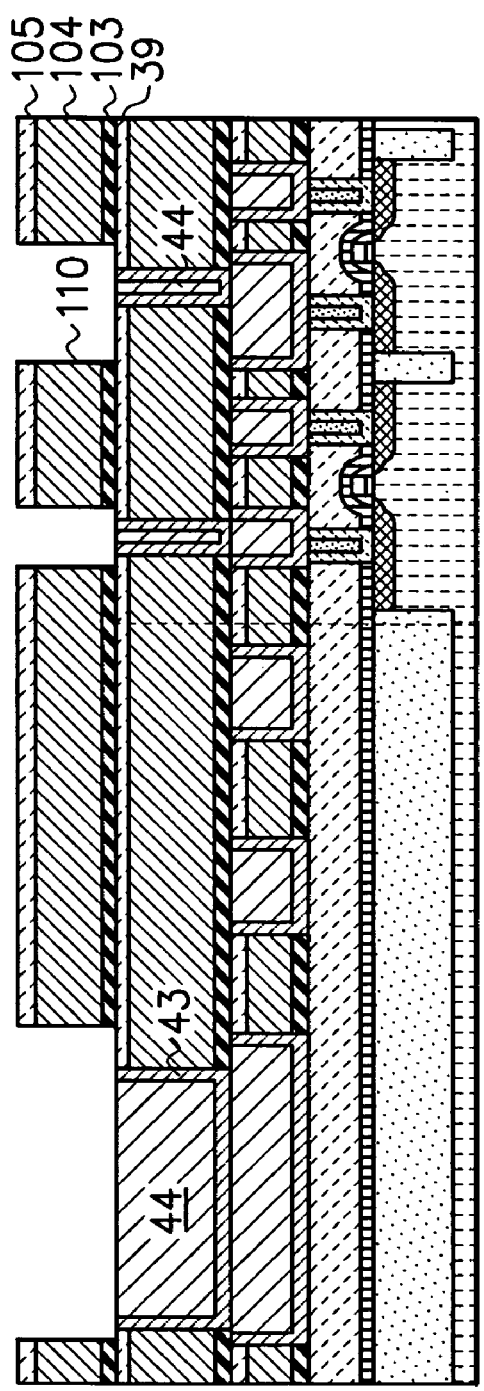
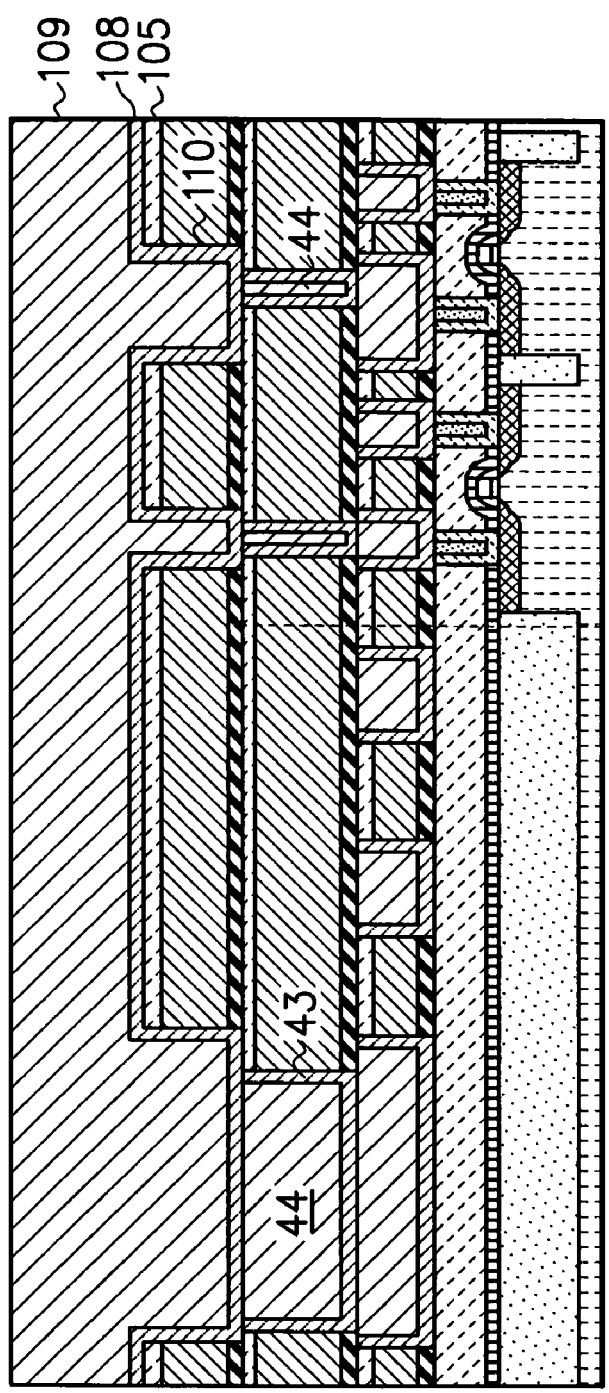
F I G. 11A
F I G. 11B

F I G. 13A
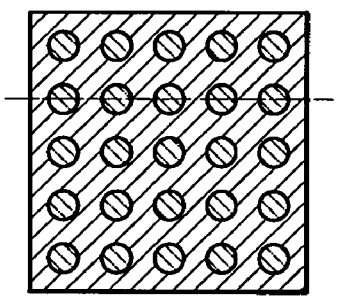
F I G. 13B
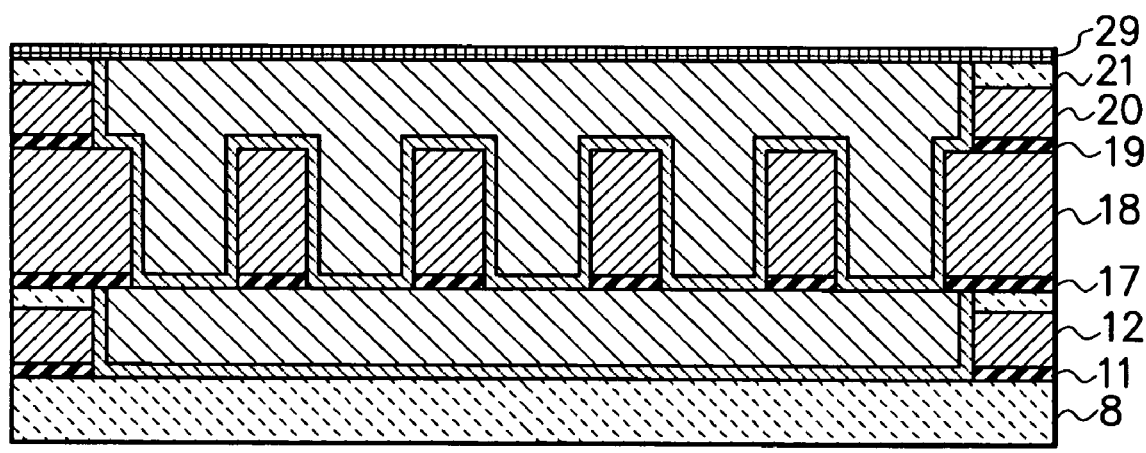

F I G. 16
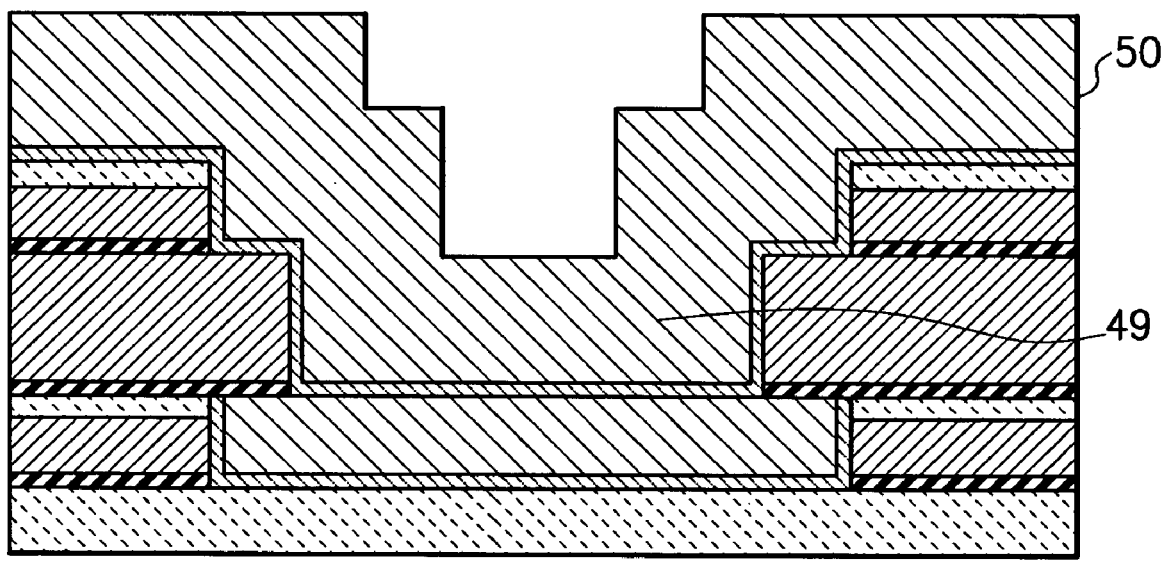

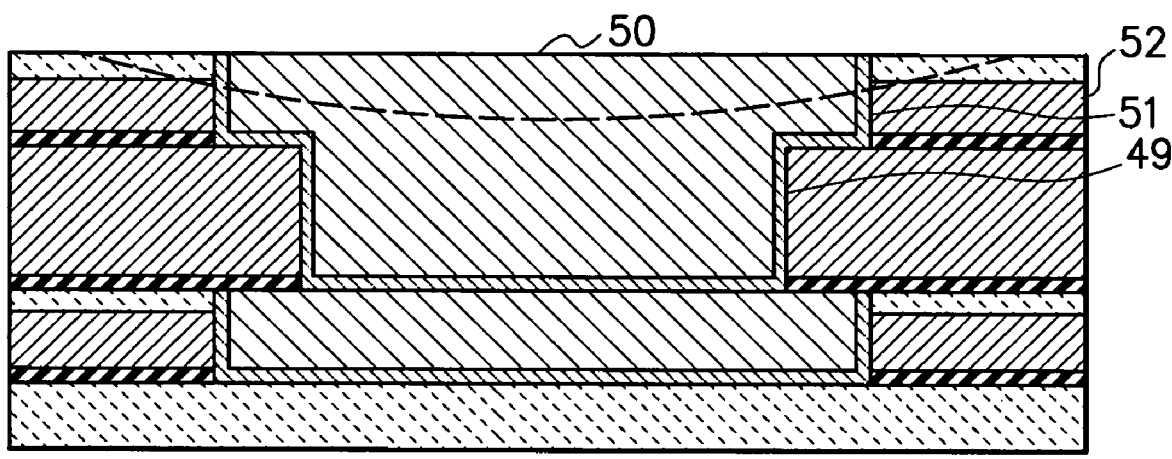
F I G. 17

F I G. 18
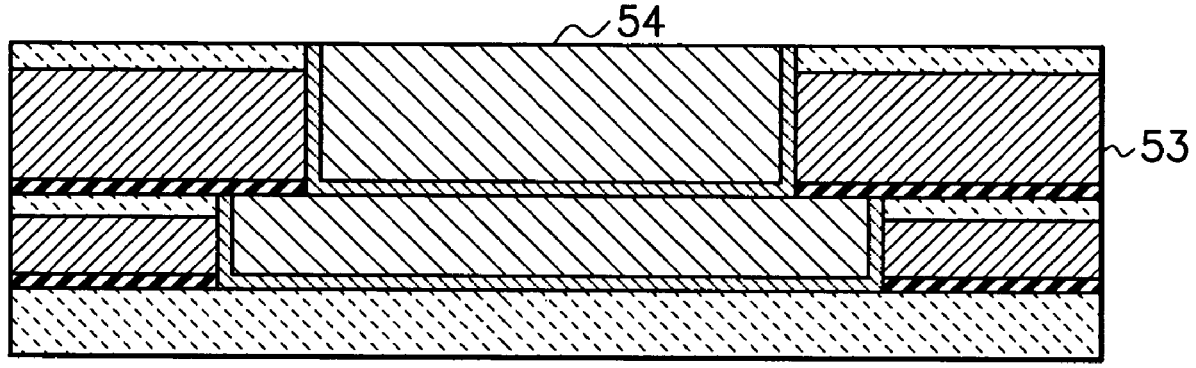

F I G. 20
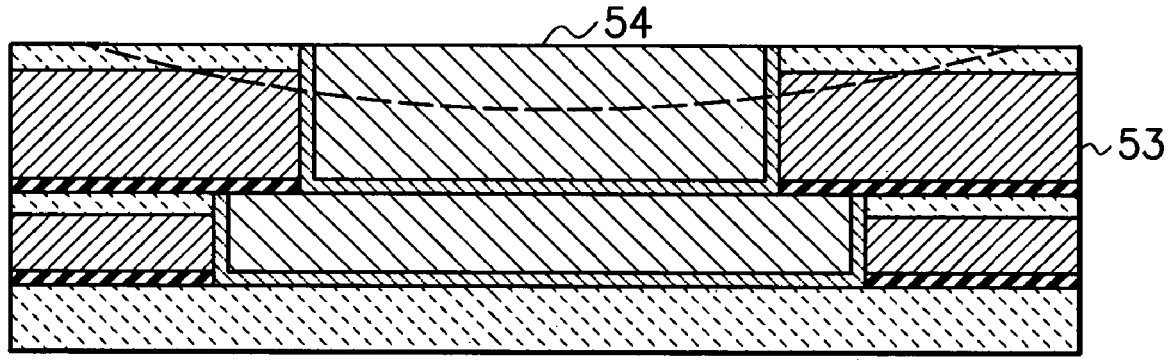

61

60
61

F I G. 25A
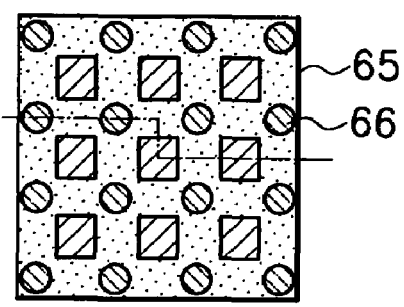
F I G. 25B
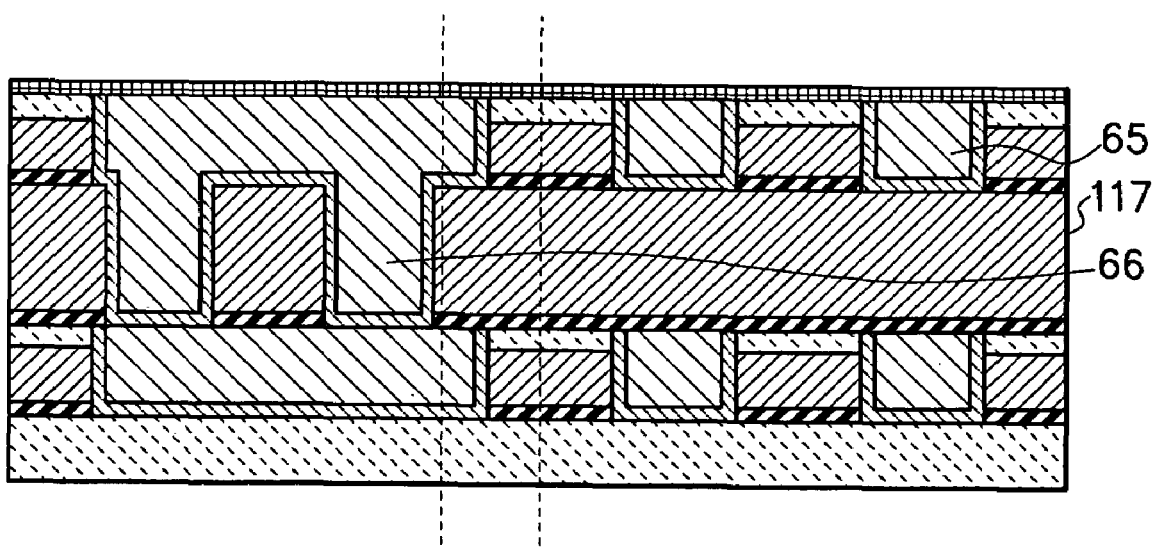

F I G. 29A
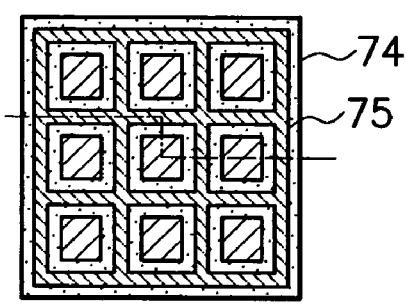
F I G. 29B
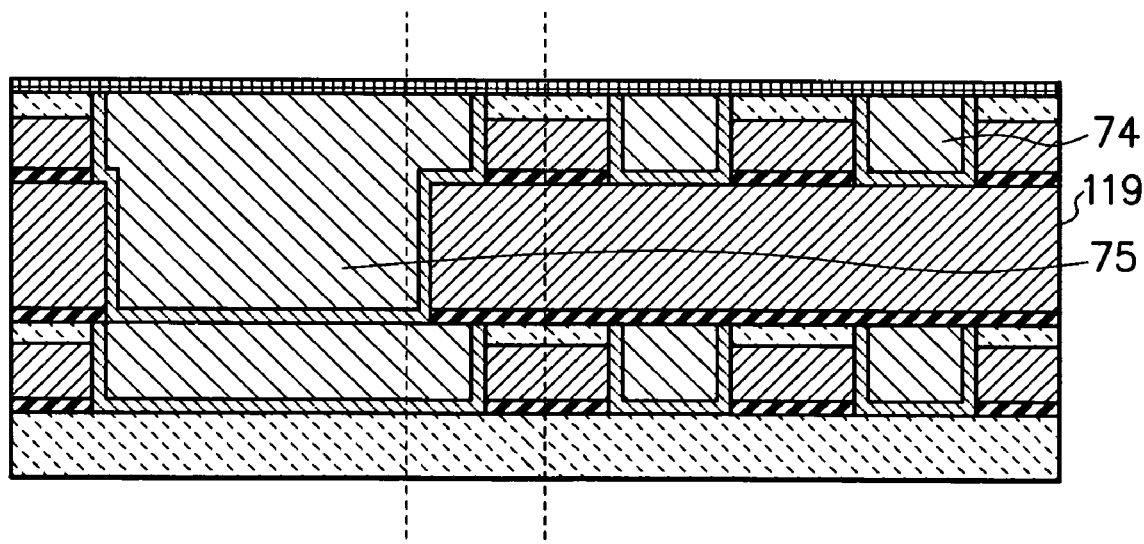

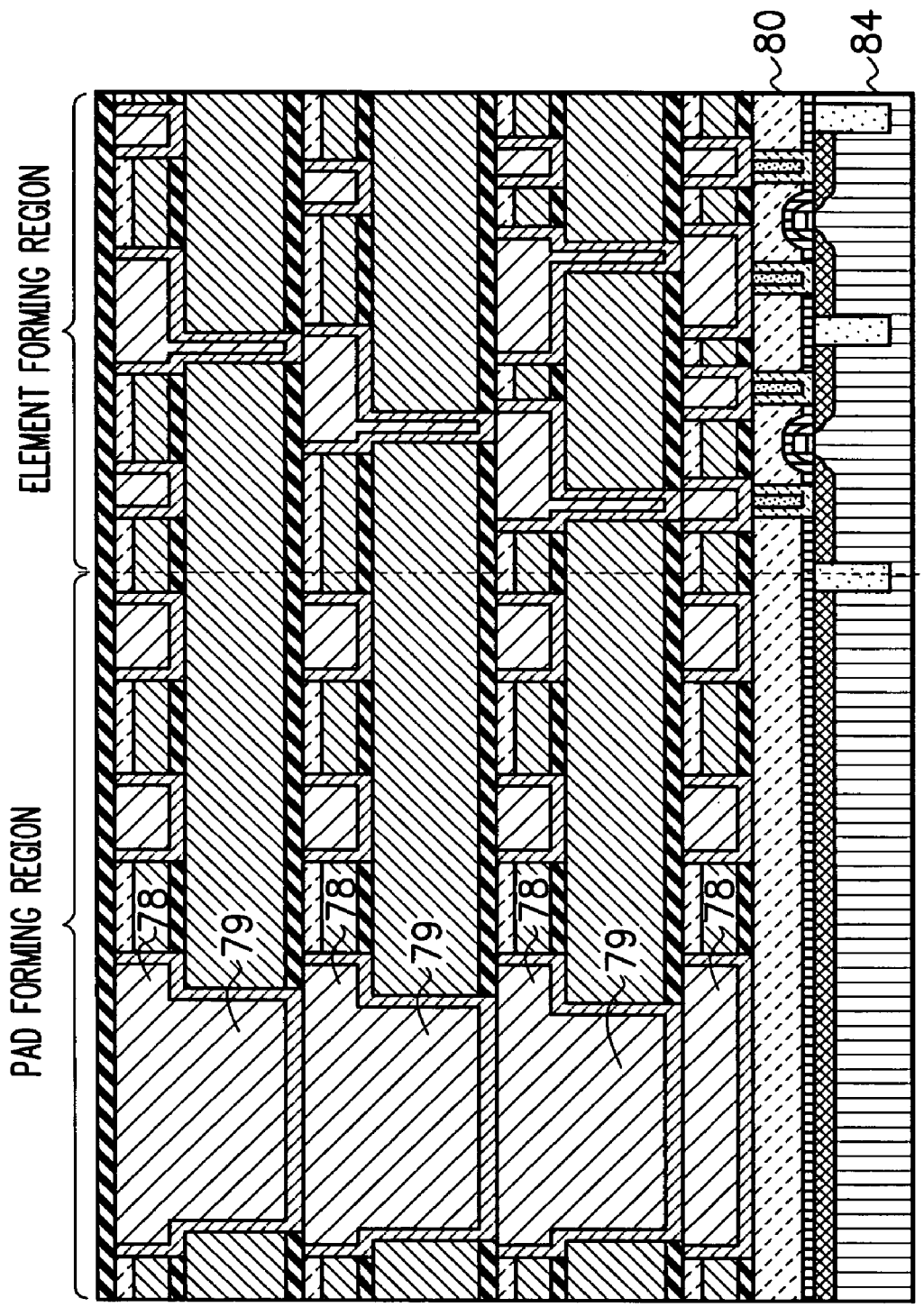

SEMICONDUCTOR DEVICE AND METHOD FOR MANUFACTURING THE SAME

This application is a continuation of international application PCT/JP03/09799, filed on Aug. 1, 2003.

TECHNICAL FIELD

The present invention relates to a semiconductor device including an element region and a pad region electrically connecting the element region and the outside, and a method for manufacturing the same.

BACKGROUND ART

Recently, along with progress in high integration of a semiconductor element and a reduction in chip size, finer wiring and multilayer wiring are acceleratingly promoted. In a logic device having such a multilayer wiring, wiring delay is becoming one of factors governing device signal delay. The device signal delay is proportional to the product of wiring resistance value and wiring capacity, and hence, to improve wiring delay, more specifically to improve operating speed of the device, a reduction mainly in a wiring resistance value is important.

To reduce the wiring resistance, formation of a Cu wiring instead of a conventional Al wiring is studied. However, under the circumstances of a material characteristic of copper and the reduction in chip size described above, a technical limit begins to occur in a method of forming the Cu wiring by directly etching the Cu film. Therefore, a method called damascene process, in which wiring is formed by a hole pattern or trench pattern being formed in an interlayer insulating film and a Cu wiring material being embedded therein, is rapidly being developed.

Also, recently, to increase operational speed of a device, a reduction in electric capacity (wiring capacity) in the same layer and between different layers is beginning to be required. Under the circumstances, adopting a low dielectric constant insulating film as the interlayer insulating film is suggested. However, the low dielectric constant insulating film is quite different from a conventional material based on a silicon oxide film such as having a siloxane bond, in physicality values such as Young's modulus, hardness, and thermal expansion, and the following problems in manufacturing processes are caused thereby.

In general, for the low dielectric constant, a change in structure inside materials such as of an atom or a molecule is necessary. If a distance between atoms or a distance between molecules is increased, the dielectric constant is lowered, but at the same time, cohesive strength is decreased since the distance between atoms or the distance between molecules is increased, with the material becoming susceptible in terms of heat or mechanical characteristic, tolerance to chemicals, and the like.

In a pad region of an LSI formed by fine processing, it is necessary to eventually form an electrode pad with a larger pattern compared with a wiring pattern inside a wiring structure. Here, the electrode pad is for electrically connecting an element region of the LSI and the outside, for characteristic evaluations in the development such as a circuit test after an LSI semiconductor structure is formed and a TEG (Test Element Group). Accordingly, it is a whole wiring with a size of approximately 40 μm to 100 μm.

A semiconductor is generally formed on a circular substrate called a wafer, and after completion of a manufacturing process, cut out as chips, and then processed into plastic packages or ceramic packages which can prevent various disturbances from affecting chips. The package has an electrode of an appropriate size for an external circuit, and when wire bonding or bump forming is carried out to electrically connect the electrode pad and an electrode of the package side, a mechanical force is applied to the inside of the pad region, and thereafter a tensile test and the like are carried out to check whether a good connection is performed.

However, when pressure bonding by pushing and the tensile test as described above are carried out, a stress is generated inside the pad region. Since a Young's modulus of a low dielectric constant material is generally low, a low dielectric layer composed of the low dielectric constant material is easily deformed when an external force is applied to the electrode pad, and the applied force is after all supported by a wiring material part of a connection hole formed with a trench pattern or a hole pattern.

As described above, if the interlayer insulating film with the smaller Young's modulus compared with the wiring material is used, the internal stress caused by pressure bonding by pushing at the time of wire bonding to the electrode pad, bump forming and the like as well as by the tensile test and the like, concentrates on the wiring material part. When the stress concentrates on the wiring material part and reaches a yield stress, a function of a wiring in the pad region is disturbed.

The present invention is made in view of the above-described problems, and its object is to provide a semiconductor device in which, when an internal stress occurs in a pad region, the stress is prevented from disproportionately concentrating on a connection hole and deterioration of a function of a wiring caused thereby can be avoided, and a method of manufacturing the same.

SUMMARY OF THE INVENTION

The present inventor has come up with various aspects of the invention described below as a result of assiduous study.

The present invention is intended for a semiconductor device that includes: an element region including a wiring structure in a low dielectric constant insulating film; and a pad region electrically connecting the element region and the outside, in which the low dielectric constant insulating film is formed in association with in the element region. The present invention is characterized in that an occupied density of a first connection hole formed in the low dielectric constant insulating film in the pad region is higher than an occupied density of a second connection hole in any of portions of the wiring structure in the element region.

Additionally, the present invention is also intended for a method for manufacturing a semiconductor device including an element region and a pad region electrically connecting the element region and the outside. A manufacturing process of the semiconductor device according to the present invention includes the steps of: forming a low dielectric constant insulating film in the pad region besides in the element region; and forming a first connection hole in the pad region and a second connection hole in the element region respectively, wherein an occupied density of the first connection hole is formed higher than an occupied density of the second connection hole in any of portions of the element region.

Further, the present inventor has also come up with a designing method for a semiconductor, as another aspect of the present invention. It is intended for the designing method for the semiconductor device to form, in association with in an element region, a wiring structure in a pad region electrically connecting the element region and the outside. More specifically, it is characterized in that designing is carried out such that, when a low dielectric constant insulating film is formed in the pad region in association with in the element region and a first connection hole and a second connection hole are respectively formed in the pad region and the element region, an occupied density of the first connection hole is formed higher than an occupied density of the second connection hole in any of portions of the element region.

BRIEF DESCRIPTION OF THE DRAWINGS

FIG. 1 is a graph showing relationships between internal stresses generated in via layers and area rates of vias in the via layers;

FIG. 3A and FIG. 3B are sectional views showing a method for manufacturing a semiconductor device according to one embodiment of the present invention step by step;

FIG. 4A and FIG. 4B are sectional views showing the method for manufacturing the semiconductor device according to the one embodiment of the present invention step by step, continued from FIG. 3A and FIG. 3B;

FIG. 5A and FIG. 5B are sectional views showing the method for manufacturing the semiconductor device according to the one embodiment of the present invention step by step, continued from FIG. 4A and FIG. 4B;

FIG. 6A and FIG. 6B are sectional views showing the method for manufacturing the semiconductor device according to the one embodiment of the present invention step by step, continued from FIG. 5A and FIG. 5B;

FIG. 8A and FIG. 8B are sectional views showing the method for manufacturing the semiconductor device according to the one embodiment of the present invention step by step, continued from FIG. 7A and FIG. 7B;

FIG. 9A and FIG. 9B are sectional views showing the method for manufacturing the semiconductor device according to the one embodiment of the present invention step by step, continued from FIG. 8A and FIG. 8B;

FIG. 10A and FIG. 10B are sectional views showing the method for manufacturing the semiconductor device according to the one embodiment of the present invention step by step, continued from FIG. 9A and FIG. 9B;

FIG. 11A and FIG. 11B are sectional views showing the method for manufacturing the semiconductor device according to the one embodiment of the present invention step by step, continued from FIG. 10A and FIG. 10B;

FIG. 13A is a plan view showing a constitution of a Cu multilayer wiring structure in a pad forming region according to a first embodiment of the present invention;

FIG. 13B is a sectional view showing the constitution of the Cu multilayer wiring structure in the pad forming region according to the first embodiment of the present invention;

FIG. 16 is a view for explaining a problem generated in the constitution of the pad forming region according to the comparative example 1;

FIG. 17 is a view for explaining another problem generated in the constitution of the pad forming region according to the comparative example 1;

FIG. 18 is a view showing a constitution example of a pad forming region according to a comparative example 2;

FIG. 20 is a view for explaining another problem generated in the constitution of the pad forming region according to the comparative example 2;

FIG. 25A is a plan view showing a constitution of a Cu multilayer wiring structure in a pad forming region according to a sixth embodiment of the present invention;

FIG. 25B is a sectional view showing the constitution of the Cu multilayer wiring structure in the pad forming region according to the sixth embodiment of the present invention;

FIG. 29A is a plan view showing a constitution of a Cu multilayer wiring structure in a pad forming region according to a tenth embodiment of the present invention;

FIG. 29B is a sectional view showing the constitution of the Cu multilayer wiring structure in the pad forming region according to the tenth embodiment of the present invention;

FIG. 32 is a sectional view showing a constitution of a Cu multilayer wiring structure in an element forming region and a pad forming region according to a twelfth embodiment of the present invention;

DETAILED DESCRIPTION OF THE PREFERRED EMBODIMENTS

—Basic Gist of Present Invention—

Figure 2:
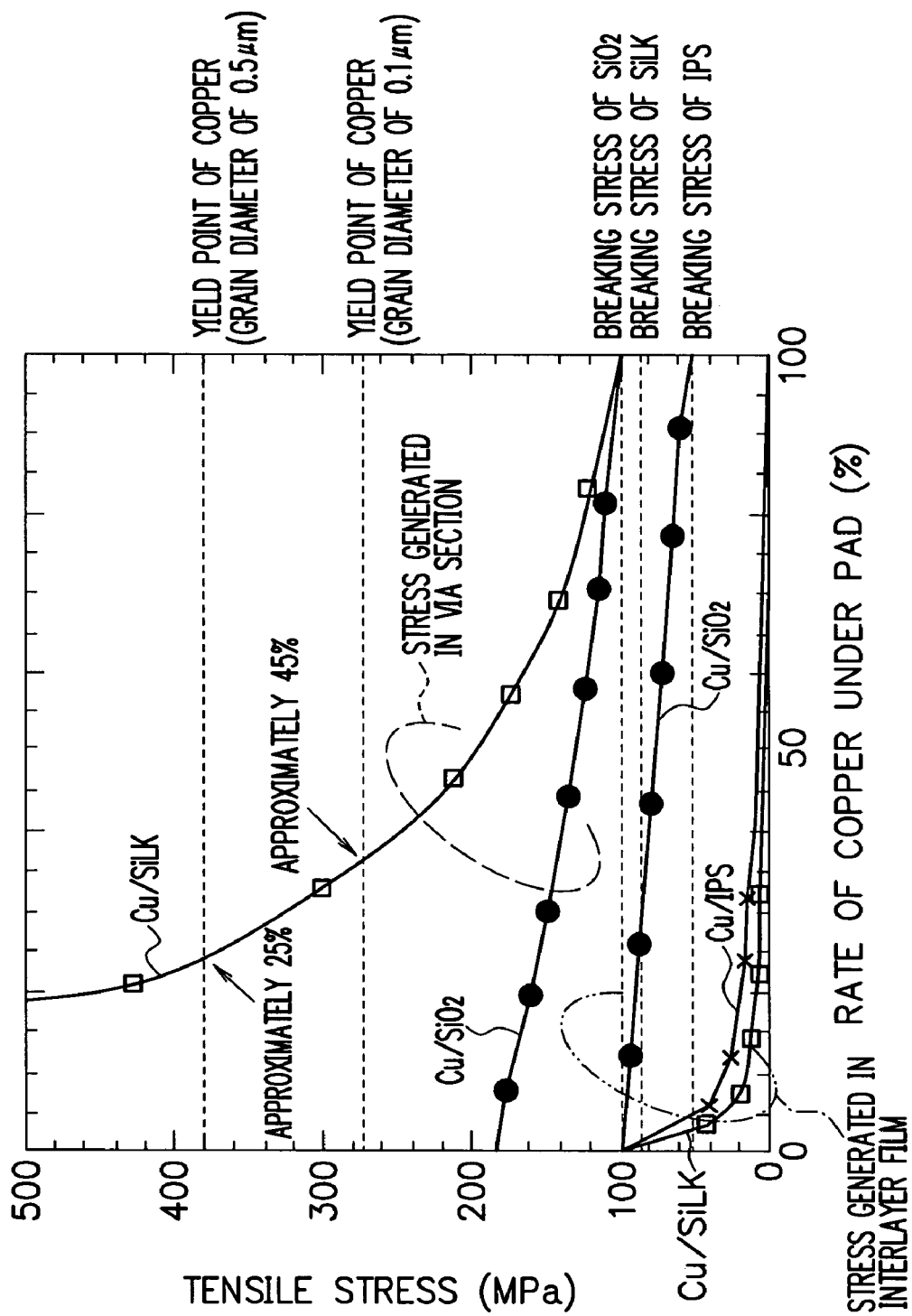
FIG. 2 is a graph showing relationships between internal stresses generated in via layers and area rates of vias in the via layers.

A force applied at a time of wire bonding or bump forming generates an internal stress in a pad region. Due to a difference of Young's modulus between a wiring material and an interlayer insulating film, the internal stress disproportionately concentrates on a connection hole side in which the wiring material is filled, and if it reaches a yield stress point of the wiring material for example, a function of a wiring in the pad region is disturbed. In order to solve such a conventional problem, the present inventor has conceived a constitution unique to the present invention in that an occupied density of the connection hole in the pad region is formed higher than an occupied density of the connection hole in any of portions in an element region. According to this constitution, the internal stress is prevented from disproportionately concentrating on the connection hole and deterioration of reliability in the function of the wiring is avoided.

The connection hole here means a part of a wiring structure in which the wiring material is embedded in a via hole in order to connect an upper wiring and a lower wiring. In following descriptions, this part of the wiring structure is referred to as a via section in the entire wiring structure. As the unique constitution which the present inventor has conceived, the occupied density of the connection hole in the pad region can be formed higher than the occupied density of the connection hole in an arbitrary portion of the element region. According also to this constitution, the above operation and effect of the present invention can be obtained.

—Mechanical Property of Interlayer Insulating Film and of Via Section (Connection Hole) in Wiring Structure—

Here, mechanical properties of an interlayer insulating film and a via section in a wiring structure will be described. Here, a description is carried out with an assumption of a tensile test for evaluating a bonding force of a bump to an electrode pad. Since the interlayer insulating film is broad in a horizontal direction compared with its film thickness, a case that the pull strength is vertically applied is considered for description convenience. Therefore, it can be considered that the same amount of distortion is generated in the via section and in the interlayer insulating film. At this time, a stress applied to the via section; σm is indicated by the following equation 1, when a Young' modulus of the via section is represented by Em and the distortion generated in the via section and the interlayer insulating film is represented by ∈.

$$\sigma m = Em \times \in \quad \text{(equation 1)}$$

Similarly, a stress applied to the interlayer insulating film; σi is indicated by the following equation 2, when a Young's modulus of the interlayer insulating film is represented by Ei.

$$\sigma i = Ei \times \in \quad \text{(equation 2)}$$

According to the equation 1 and the equation 2, a ratio of the stresses applied to a Cu film and the interlayer insulating film is equal to a ratio of Young's modulus as indicated in the following equation 3.

$$\sigma m : \sigma i = Em : Ei \quad \text{(equation 3)}$$

For example, if a Young's modulus of copper is assigned to Em and a Young's modulus of "SiLK (SiLK: a registered trademark of The Dow Chemical Company, an organic insulating film material which is made of a polyarylether based compound)" being a low dielectric constant insulating material is assigned to Ei in the equation 3, and on the other hand, as a comparison, if the Young's modulus of copper is assigned to Em and a Young's modulus of silicon dioxide is assigned to Ei in the equation 3, the following equation 4 and equation 5 are obtained. Incidentally, the Young's modulus of copper, "SiLK", and silicon dioxide are cited from the following table 1.

$$\sigma cu : \sigma silk = 1 : 0.020 \quad \text{(equation 4)}$$

$$\sigma cu : \sigma sio = 1 : 0.55 \quad \text{(equation 5)}$$

As indicated in the equation 4 and the equation 5, with regard to a ratio of the internal stresses applied to the via section and the interlayer insulating film, a proportion of the internal stress applied to the interlayer insulating film is lower when the interlayer insulating film is composed of a low dielectric constant insulating film, compared with a case that the interlayer insulating film is composed of a silicon oxide film.

Next, a calculating equation for a value of the stress applied on the via section and the interlayer insulating film is to be obtained. A balance between an outer force by the tensile test; F and a force of supporting by the via section and the interlayer insulating film is indicated in the following equation 6. Here, Sm represents an area of the via section, and Si represents an area of the interlayer insulating film.

$$F = \sigma m \times Sm + \sigma i \times Si \quad \text{(equation 6)}$$

When the equation 1 and the equation 2 are assigned to the equation 6, the following equation 7 and equation 8 are respectively derived.

$$F = \sigma m \times Sm + (Ei/Em) \times \sigma m \times Si = \sigma m \times (Sm + (Ei/Em) \times Si) \quad \text{(equation 7)}$$

$$F = (Em/Ei) \times \sigma i \times Sm + \sigma i \times Si = \sigma i \times ((Em/Ei) \times Sm + Si) \quad \text{(equation 8)}$$

The equation 7 and the equation 8 are respectively solved about σm and σi, and graphed as functions of area rates of the via section and the interlayer insulating film, as shown in FIG. 1 and FIG. 2. In FIG. 1, a case that a pull strength of 40 gf is applied to a circular electrode pad of 40 μm in diameter is shown, and in FIG. 2, a case that a pull strength of 20 gf is applied to a circular electrode pad of 50 μm in diameter is shown.

First, the graph of FIG. 1 will be explained. When the interlayer insulating film is composed of the silicon oxide film and the via section is composed of the Cu film ($SiO_2$/Cu in the drawing), the internal stress applied to the via section does not increase so sharply even if the area rate of the interlayer insulating film increases. On the other hand, when the interlayer insulating film is composed of "SiLK" and the via section is composed of the Cu film ("SiLK"/Cu in the drawing), the internal stress applied to the via section rapidly increases if the area rate of the interlayer insulating film increases.

Additionally, in the graph of FIG. 1, there are indicated yield stress points of copper of 0.1 μm, 0.5 μm, and 1.0 μm in grain diameter, and it is understood that when the interlayer insulating film is composed of "SiLK", the internal stress applied to the via section reaches the yield stress point depending on the area rate of the interlayer insulating film. Incidentally, the yield stress point of copper is a stress value, if the stress at and above which is applied yield occurs in the copper. As described above, when the via sections are composed of the Cu films with the same grain diameter, differences between the area rates of the interlayer insulating films with which the yield stress points are reached become approximately double, depending on that the interlayer insulating film is composed of "SiLK" or is composed of the silicon oxide film.

Further, in the graph of FIG. 1, there are also indicated cases that the interlayer insulating film is composed of porous silica based IPS (Interpapenetrated Siloxane: a registered trademark of Catalysts & Chemical Industries Co., Ltd.)" or organosilicate glass (in the drawing, "BD (Black Diamond): a registered trademark of Applied Materials, Inc.") being low dielectric constant insulating materials and the via section is composed of the Cu film (in the drawing, "IPS"/Cu, "BD"/Cu, respectively). Since Young's modulus of "IPS" and "BD" are as low as 11 (Gpa) and 5.5 (Gpa) respectively, the internal stress applied to the via section rapidly increases in accordance with an increase in the area rate of the interlayer insulating film, as in the case that the interlayer insulating film is composed of "SiLK".

A graph of FIG. 2 indicates a case that the interlayer insulating film is composed of "SiLK" and the via section is composed of the Cu film (in the drawing, Cu/"SiLK"), a case that the interlayer insulating film is composed of the silicon oxide film and the via section is composed of the Cu film (in the drawing, Cu/$SiO_2$), and a case that the interlayer insulating film is composed of porous silica based "IPS" and the via section is composed of the Cu film (in the drawing, Cu/"IPS").

Though examples shown in FIG. 2 are experiments under different conditions from the examples of FIG. 1, there is also noted a case that with an increase in the area rate of the interlayer insulating film, the internal stress is rapidly applied to the via section and reaches the yield stress point of copper, in the case that the interlayer insulating film is composed of the low dielectric constant insulating material "SiLK". On the other hand, in the case that the interlayer insulating film is composed of the silicon oxide film, even with the increase in the area rate of the interlayer insulating film, the internal stress is not applied to the via section so hard and does not reach the yield stress point of copper.

Additionally, in FIG. 2, the internal stresses applied to the interlayer insulating films are also indicated. In the case that the interlayer insulating film is composed of porous silica based "IPS" or "SiLK", with the increase in the area rate of the interlayer insulating film, the internal stress applied to the interlayer insulating film rapidly increases at a certain point and reaches breaking stress point of each. Here, the breaking stress point is a stress value, if the stress at and above which is applied breaking occurs. On the other hand, when the interlayer insulating film is composed of the silicon oxide film, the internal stress applied to the interlayer insulating film does not increase so sharply and does not reach its breaking stress point even if the area rate of the interlayer insulating film increases.

In the present invention, the interlayer insulating film is composed of the low dielectric constant insulating material in order for a reduction in an electric capacity (wiring capacity) in the same layer and between different layers. In particular, as the low dielectric constant material it is preferable to use materials with Young's modulus of 20 GPa and below such as organosilicate glass "BD", "SiLK", and "IPS". However, as described above, when the interlayer insulating film under the electric pad is composed of the low dielectric constant insulating material such as organosilicate glass "BD", "SiLK", and "IPS", disturbances are apt to occur in the via section and the interlayer insulating film due to generation of the internal stress, and reliability of the function of the wiring can be decreased. On the other hand, in the present invention, it becomes possible to prevent the internal stress from disproportionately concentrating on the via section, by disposing the via section under the electrode pad in high density.

Hereinafter, embodiments of the present invention will be described in detail with reference to attached drawings. FIG. 3A to FIG. 12 are schematic sectional views showing methods for manufacturing semiconductor devices according to the embodiments of the present invention step by step.

—Formation of MOS Transistor Structure—

First, MOS transistor structures are formed on a silicon substrate.

More specifically, as shown in FIG. 3A, element isolation structures 2 are formed in element isolation regions of a silicon substrate 1 by an STI (Shallow Trench Isolation) method, so that an element active region is delineated in an element forming region and the element isolation structure 2 is formed on an entire surface of a pad forming region.

Subsequently, a gate insulating film 3 is formed by a thermal oxidation method only in the element active region of the element forming region. Then, a polycrystalline silicon film is deposited on an entire surface by a CVD method and then patterned so that gate electrodes 4 are formed only in the element active region.

Subsequently, with the gate electrodes 4 being masks, impurities are shallowly ion-implanted in low concentration, and a silicon oxide film is deposited by the CVD method, then anisotropic etching is performed on an entire surface. Hereby, the silicon oxide film remains only on sides of the gate electrodes 4 to form sidewalls 5. Next, with the gate electrodes 4 and sidewalls 5 being masks, once again the impurities are deeply ion-implanted in high concentration to form sources/drains 6 of LDD structures.

Subsequently, after a silicon nitride film 7 is formed on an entire surface, a silicon oxide film 8 to be an interlayer insulating film is deposited. Then, the silicon oxide film 8 is patterned in such a manner that portions of surfaces of the sources/drains 6 appear, to form contact holes 9.

Subsequently, after TiN films 10 to be base films are formed in such a manner to cover internal surfaces of the contact holes 9, tungsten is deposited in such a manner to fill the contact holes 9. Then surfaces are planarized by a CMP (Chemical-Mechanical Polishing) method so that tungsten plugs are formed. Incidentally, in order to electrically connect the gate electrodes 4 and wirings, plugs are necessary also on the gate electrodes 4. However, it should be understood that, here, the plugs for the sources/drains 6 and the plugs for the gate electrodes 4 are considered to be not on the same cross section, and on FIG. 3A and the following drawings the plugs for the gate electrodes 4 will be refrained from being shown.

—Formation of Cu Wiring Structure; Dual Damascene Method—

Next, a Cu wiring structure is formed on the above-described MOS transistor structures. Here, first a case that a Cu multilayer wiring is formed by a dual damascene method will be described.

As shown in FIG. 3B, on the silicon oxide film 8 to be the interlayer insulating film for wiring layers, a silicon carbide film (SiC film) 11 to be an etching stopper film is formed to be approximately 70 nm in film thickness. Next, after an organosilicate glass film (SiOC film) 12 to be an interlayer insulting film for wiring layers and a silicon oxide film (SiO film) 101 to be a protective film at a time of a polishing process by the CMP method are formed to be approximately 350 nm and 150 nm respectively in film thickness, a photoresist 13 is coated, and then exposed and developed to form wiring patterns 14.

Subsequently, as shown in FIG. 4A, with the photoresist 13 in which the wiring patterns 14 are formed being a mask, the organosilicate glass film 12 and the silicon oxide film 101 are anisotropically etched with mixed gas including CF-based gas until the silicon carbide film 11 is exposed.

Next, after the remaining photoresist 13 is removed by ashing, the silicon carbide film 11 is removed by etching with mixed gas including CHF-based gas, to form wiring trenches. Here, if the silicon oxide film 8 is not damaged by ashing, it is possible that the silicon oxide film 101, the organosilicate glass film 12, and the silicon carbide film 11 are etched altogether with mixed gas including CF-based gas and then the photoresist 13 is removed by ashing. Thereafter, moderate heat treatment is applied so that materials absorbed by the silicon carbide film 11 and the organosilicate glass film 12 are removed by degassing.

Next, after a barrier metal film 15 composed of for example tantalum nitride (TaN) is formed to be approximately 30 nm in film thickness, a Cu-film 16 is formed to be approximately 1500 nm in film thickness. Here, as a method for forming the Cu film 16, there can be used a plating method in which a seed metal film is formed on the barrier metal film 15 with a sputtering device and this seed metal film is utilized as an electrode, and then the Cu film 16 can be formed.

Subsequently, as shown in FIG. 4B, after polishing by the CMP method is performed until the silicon oxide film 101 is exposed, formation is carried out in such a manner that the Cu film 16 remains only in the wiring trenches. Next, there are sequentially formed a silicon carbide film (SiC film) 17 to be an etching stopper film and Cu diffusion barrier film, an organosilicate glass film 18 to be an interlayer insulating film, a silicon carbide film 19 to be an etching stopper film at a time of wiring layer formation, an organosilicate glass film 20 to be an interlayer insulating film for wiring layers, and a silicon oxide film 21 to be a protective film at a time of polishing by the CMP method. Here, the silicon carbide film 17 is formed to be approximately 70 nm in film thickness, the organosilicate glass film 18 is formed to be approximately 600 nm in film thickness, the silicon carbide film 19 is formed to be approximately 70 nm in film thickness, the organosilicate glass film 20 is formed to be approximately 350 nm in film thickness, and the silicon oxide film 21 is formed to be approximately 150 nm in film thickness.

Next, a photoresist 22 is coated on the silicon oxide film 21, then exposed and developed to form via patterns 23 for forming via holes. At this time, in the pad forming region, a via pattern 23 with a larger cross-sectional area than those in the element forming region is formed.

Subsequently, as shown in FIG. 5A, the anisotropic etching is performed on the silicon oxide film 21, the organosilicate glass film 20, the silicon carbide film 19, and the organosilicate glass film 18 in sequence, with mixed gas including CF-based gas until the silicon carbide film 17 is exposed, with various process conditions being altered. Hereby, in the pad forming area, a via hole 24 with a larger area than those in the element forming region is formed.

Next, after a resin 25 to be used as a protective film is embedded in lower portions of the via holes by a method of coating and melting, a photoresist 26 is coated on an entire surface, then exposed and developed to form wiring patterns 27.

Subsequently, as shown in FIG. 5B, with the photoresist 26 in which the wiring patterns 27 are formed being a mask, the silicon oxide film 21 and the organosilicate glass 20 are anisotropically etched with mixed gas including CF-based gas until the silicon carbide film 19 is exposed, to form wiring trenches 102. Next, the photoresist 26 and the resin 25 are removed simultaneously by ashing.

Subsequently, as shown in FIG. 6A, the silicon carbide film 17 remaining in the bottom portions of the via holes 24 and the silicon carbide film 19 remaining in the bottom portions of the wiring trenches 102 are anisotropically etched and removed with mixed gas including CF-based gas. Next, after moderate heat treatment is applied so that materials absorbed by a contact surface of the Cu film 16, the silicon carbide film 17, the organosilicate glass film 18, the silicon carbide film 19, and the organosilicate glass film 20 are removed by degassing, a barrier metal film 121 composed of for example tantalum nitride is formed to be approximately 30 nm in film thickness and then a Cu film 28 is embedded in the wiring trenches 102 and the via holes 24 with a film thickness thereof being approximately 1500 nm by the plating method.

Subsequently, as shown in FIG. 6B, the Cu film 28 and the barrier metal film 121 are polished by the CMP method until the silicon oxide film 21 is exposed, so that the Cu film 28 and the barrier metal film 121 remain only in the wiring trenches 102 and the via holes 24. After this, if the wiring formed of the Cu film 28 is used as an electrode pad, a silicon nitride film 29 to function as a cover film is formed on the wiring layer and an opening is formed in a part thereof. Then, a metal wire for example is connected to the opening to electrically connect the electrode pad and the outside. If a wiring structure is to be formed further above, repetition of the manufacturing process similar to that in FIG. 3A to FIG. 6B enables formation of further multilayer wiring structure.

Additionally, as another constitution example of the electrode pad, a constitution capable of preventing erosion due to surface exposure of the Cu film 28 is possible by forming an Al layer on the Cu film 28, and connecting the outside and the electrode pad with an Al metal wire which has good adhesiveness with the Al layer, or forming a bump on the Al layer.

According to the above, under the electrode pad in the pad forming region, there is formed the via hole with the larger cross-sectional area than those in the element forming region. Therefore, if the same or larger number of via sections as/than that in the element forming region are formed in the pad forming region, it is possible to make an occupied density of the via section in the pad forming region higher than that in the element forming region. Hereby, when an internal stress is generated, concentration of excessive load to the via section can be prevented, and consequently, it is possible to avoid deterioration factors of a function of a wiring such as that yield occurs in the via section (Cu film) at a time that an external force is applied to the electrode pad.

It is a matter of course that the above effect can be obtained if the occupied density of the via section of the pad forming region is formed higher than the occupied density of the via section in an arbitrary portion of the element forming region. The above effect can be obtained as well, if any of portions of the element forming region is locally taken into consideration (for example, a portion where the occupied density of the via section is the lowest) and the occupied density of the via section in the pad forming region is formed higher than the occupied density of the via section at least in that portion.

—Formation of Cu Multilayer Wiring Structure; Single Damascene Method—

Next, a method for manufacturing a Cu multilayer wiring structure by a single damascene method will be described. The formation of the MOS transistor structures is already described based on FIG. 3A and description thereof will be restrained here.

Figure 7A:
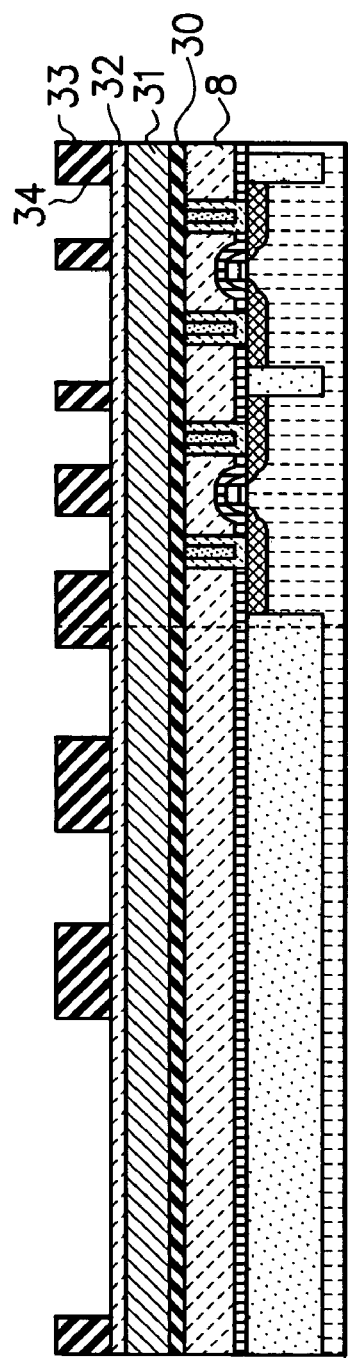
FIG. 7A and FIG. 7B are sectional views showing the method for manufacturing the semiconductor device according to the one embodiment of the present invention step by step, continued from FIG. 3A and FIG. 3B.

First, as shown in FIG. 7A, on a silicon oxide film 8 to be an interlayer insulating film, a silicon carbide film 30 to be an etching stopper film is formed to be approximately 70 nm in film thickness. Next, an organosilicate glass film 31 and a silicon oxide film 32 are formed respectively to be approximately 350 nm and 150 nm in film thickness.

Next, a photoresist 33 is coated on the silicon oxide film 32, then exposed and developed, to form wiring patterns 34 for forming wiring trenches in the organosilicate glass film 31 and the silicon oxide film 32.

Figure 7B:
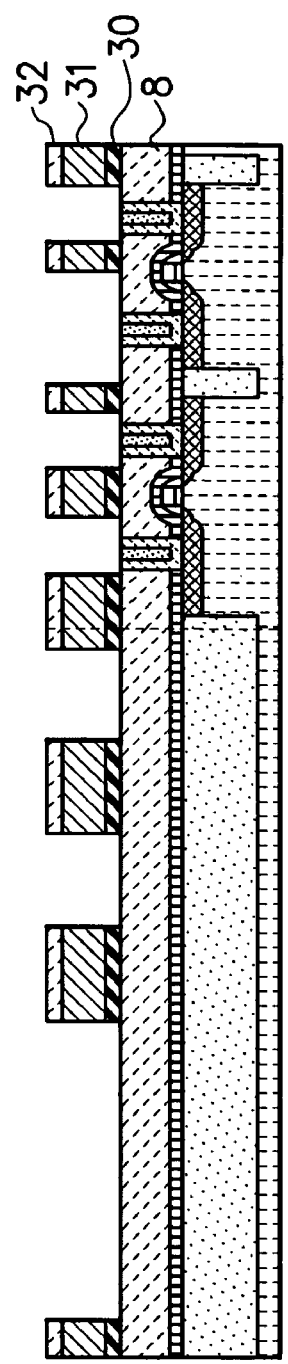

Subsequently, as shown in FIG. 7B, with the photoresist 33 in which wiring patterns 34 are formed being a mask, the organosilicate glass film 31 and the silicon oxide film 32 are anisotropically etched with mixed gas including CF-based gas, until the silicon carbide film 30 is exposed. Next, after the remaining photoresist 33 is removed by ashing, the silicon carbide film 30 is removed by etching with mixed gas including CHF-based gas, to form wiring trenches. Here, if the silicon oxide film 8 is not damaged by ashing, it is possible that the silicon oxide film 32, the organosilicate glass film 31, and the silicon carbide film 30 are etched altogether with mixed gas including CF-based gas and then the photoresist 33 is removed by ashing. Thereafter, moderate heat treatment is applied so that materials absorbed by the organosilicate glass film 31 and the silicon carbide film 30 are removed by degassing.

Next, as shown in FIG. 8A, after a barrier metal film 35 composed of for example tantalum nitride is formed to be approximately 30 nm in film thickness, a Cu film 36 is formed to be approximately 1500 nm in film thickness.

Subsequently, as shown in FIG. 8B, polishing using the CMP method is performed until the silicon oxide film 32 is exposed, so that the Cu film 36 remains only in the wiring trenches. Next, there are sequentially formed a silicon carbide film 37 to be an etching stopper film and Cu diffusion barrier film, an organosilicate glass film 38 to be an interlayer insulating film for via layers, and a silicon-oxide film 39. Here, the silicon carbide film 37 is formed to be approximately 70 nm in film thickness, the organosilicate glass film 38 is formed to be approximately 450 nm in film thickness, and the silicon oxide film 39 is formed to be approximately 150 nm in film thickness.

Next, a photoresist 40 is coated on the silicon oxide film 39, then exposed and developed, to form via patterns 41 for forming via holes. At this time, in the pad forming region, a via pattern 41 with a larger cross-sectional area than those in the element forming region is formed.

Subsequently, as shown in FIG. 9A, the anisotropic etching is performed on the silicon oxide film 39 and the organosilicate glass film 38 with mixed gas including CF-based gas until the silicon carbide film 37 is exposed, with various process conditions being altered.

Subsequently, as shown in FIG. 9B, the silicon carbide film 37 remaining in the bottom portions of via holes 42 is removed by the anisotropic etching, with mixed gas including CHF-based gas. Hereby, in the pad forming area, the via hole 42 with a larger cross-sectional area than those in the element forming region is formed. Next, after moderate heat treatment is applied so that materials absorbed by a contact surface of the Cu film 36, the silicon carbide film 37, and the organosilicate glass film 38 are removed by degassing, a barrier metal film 43 composed of tantalum nitride is formed to be approximately 30 nm in film thickness, and then a Cu film 44 is embedded in the via holes 42 to be approximately 1500 nm in film thickness by the plating method.

Next, as shown in FIG. 10A, the Cu film 44 and the barrier metal film 43 are polished by the CMP method until the silicon oxide film 39 is exposed, so that the Cu film 44 and the barrier metal film 43 remain only in the via holes 42.

Subsequently, as shown in FIG. 10B, there are sequentially formed a silicon carbide film 103 to be an etching stopper film and Cu diffusion barrier film, an organosilicate glass film 104 to be an interlayer insulating film for wiring layers, and a silicon oxide film 105 to be a protective film at a time of polishing process by the CMP method. Here, the silicon carbide film 103 is formed to be approximately 70 nm in film thickness, the organosilicate glass film 104 is formed to be approximately 350 nm in film thickness, and the silicon oxide film 105 is formed to be approximately 150 nm in film thickness. Next, a photoresist 106 is coated on the silicon oxide film 105, and then exposed and developed, to form wiring patterns 107 for forming wiring trenches.

Subsequently, as shown in FIG. 11A, with the photoresist 106 in which the wiring patterns 107 are formed being a mask, the silicon oxide film 105 and the organosilicate glass film 104 are anisotropically etched with mixed gas including CF-based gas, until the silicon carbide film 103 is exposed, and then the remaining photoresist 106 is removed by ashing. Then, the silicon carbide film 103 is anisotropically etched until the silicon oxide film 39 is exposed, to form wiring trenches 110. Next, moderate heat treatment is applied so that materials absorbed by a contact surface of the Cu film 44, the organosilicate glass film 104, and the silicon carbide film 103 are removed by degassing.

Subsequently, as shown in FIG. 11B, after a barrier metal film 108 composed of for example tantalum nitride is formed to be approximately 30 nm in film thickness, a Cu film 109 is embedded in the wiring trenches 110 with a film thickness thereof being approximately 1500 nm by the plating method.

Figure 12:
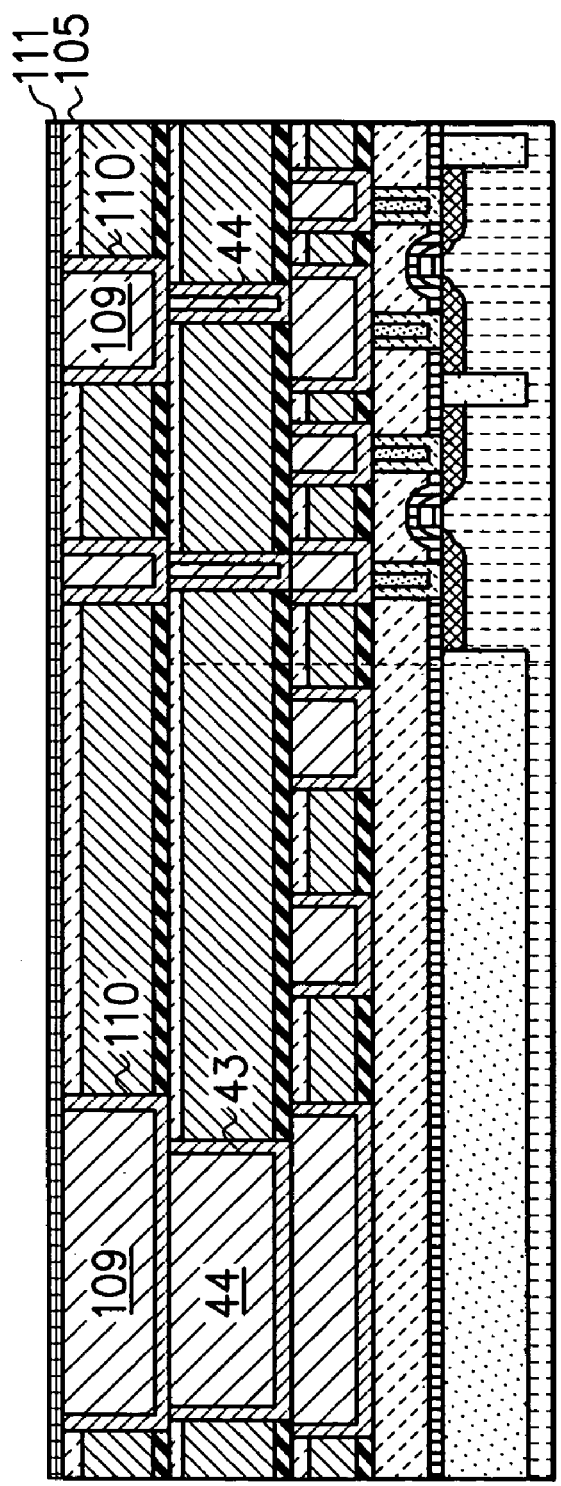
FIG. 12 is a sectional view showing the method for manufacturing the semiconductor device according to the one embodiment of the present invention step by step, continued from FIG. 11A and FIG. 11B.

Next, as shown in FIG. 12, the Cu film 109 and the barrier metal film 108 are polished by the CMP method until the silicon oxide film 105 is exposed, so that the Cu film 109 and the barrier metal film 108 remain only in the wiring trenches 110. After this, if the wiring formed of the Cu film 109 is used as an electrode pad, a silicon nitride film 111 to function as a cover film is formed on the wiring layer and an opening is formed in a part thereof. Then, a metal wire for example is connected to the opening to electrically connect the electrode pad and the outside. If a wiring structure is to be formed further above, repetition of the manufacturing process similar to that in FIG. 8B to FIG. 12 enables formation of further multilayer wiring structure.

Additionally, as another constitution example of the electrode pad, a constitution capable of preventing erosion due to surface exposure of the Cu film 109 is possible by forming an Al layer on the Cu film 109, and connecting the outside and the electrode pad with an Al metal wire which has good adhesiveness with the Al layer, or forming a bump on the Al layer.

As described above, also by the single damascene method, the via section with the larger cross-sectional area than those in the element forming region can be formed in the pad forming region. Therefore, if the same or larger number of via sections as/than that in the element forming region are formed in the pad forming region, it is possible to make an occupied density of the via section in the pad forming region higher than that in the element forming region. Meanwhile, formation of the high-density via sections in the pad forming region is possible by, in addition to forming respective via sections to have large cross-sectional areas, forming via sections with equivalent cross-sectional areas in both the element forming region and the pad forming region and forming a larger number of via sections per unit area in the pad forming region than in the element forming region.

It is a matter of course that the above effect can be obtained if the occupied density of the via section in the pad forming region is formed higher than the occupied density of the via section in an arbitrary portion of the element forming region. The above effect can be obtained as well, if any of portions of the element forming region is locally taken into consideration (for example, a portion where the occupied density of the via section is the lowest) and the occupied density of the via section in the pad forming region is formed higher than the occupied density of the via section at least in that portion.

First Embodiment

FIG. 13A and FIG. 13B are a plan view and a sectional view showing a constitution of a Cu multilayer wiring structure in a pad forming region according to a first embodiment of the present invention. Since the below-described first to sixteenth embodiments are manufactured by the manufacturing processes similar to ones described above, detailed description thereof will be restrained. Incidentally, FIG. 13B is a view showing a cross-sectional structure of the pad forming region taken along a dashed line shown in the plan view of FIG. 13A.

The pad forming region according to the first embodiment is formed by a dual damascene method as shown in FIG. 13A and FIG. 13B, and a plurality of via sections are distributed evenly in a region enclosed by a wiring, so that the via sections are disposed in higher density than that in any of portions of a element forming region. Though the via sections with circular cross-sectional structures are shown in FIG. 13A and FIG. 13B, it is possible to adopt rectangular shapes or other arbitrary shapes. With regard to a manufacturing method, the via sections according to the present embodiment can be formed by altering the via patterns 23 in the photoresist 22 shown in FIG. 4B. Incidentally, "enclosed region" here means a region below a wiring formation region and enclosed thereby.

Figure 14:
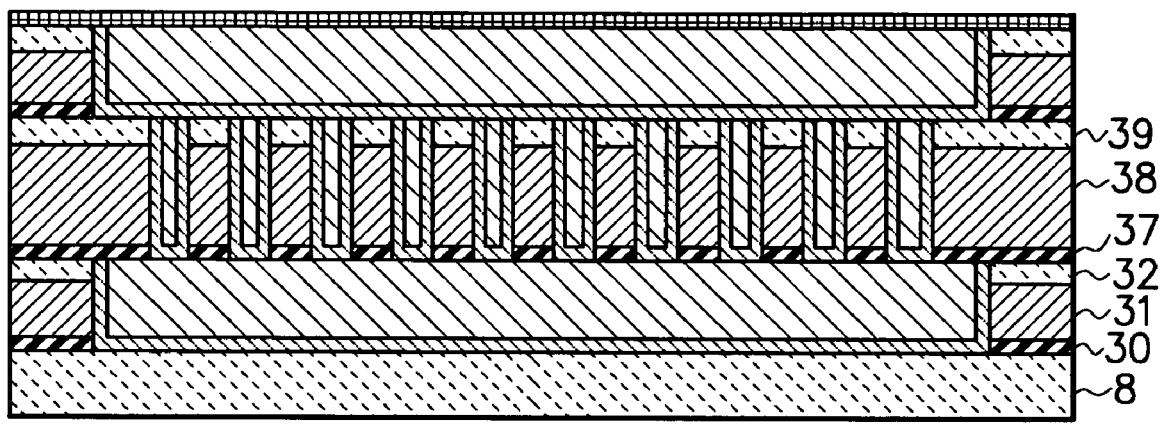
FIG. 14 is a sectional view of a Cu multilayer wiring structure similar to that in the pad forming region according to the first embodiment of the present invention, structured by a single damascene method.

Meanwhile, though the pad forming region formed by the dual damascene method is described in the present embodiment, it is possible to form a Cu multilayer wiring structure with a similar via section constitution by a single damascene method as shown in FIG. 14. With regard to a manufacturing method in this case, the via sections according to the present embodiment can be formed by altering the via patterns 41 in the photoresist 40 shown in FIG. 8B.

COMPARATIVE EXAMPLE 1

Figure 15A:
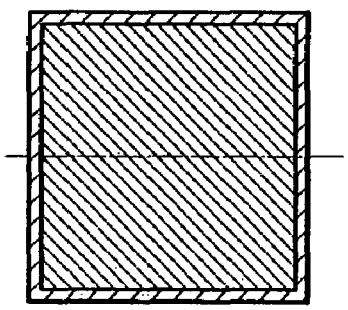
FIG. 15A is a plan view showing a constitution example of a pad forming region according to a comparative example 1.
Figure 15B:
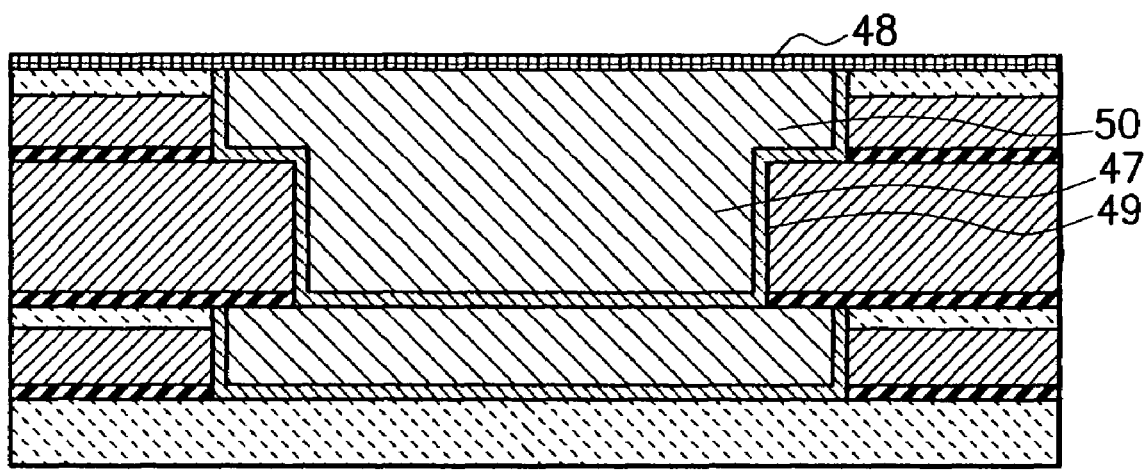
FIG. 15B is a sectional view showing the constitution example of the pad forming region according to the comparative example 1.

Here, there is described a constitution example of a pad forming region which can be formed by the dual damascene method as in the above first embodiment, as a comparative example 1. FIG. 15A and FIG. 15B are a plan view and a sectional view showing the constitution example of the pad forming region according to the comparative example 1. As shown in FIG. 15A and FIG. 15B, in the comparative example 1, there is formed a large via section 47, with the low dielectric constant insulating film being completely eliminated in a region enclosed by a wiring 48, in order to prevent an internal stress from disproportionately concentrating on the via section 47 side.

However, in order to form the via section 47 according to the comparative example 1, it is necessary to form a via hole 49 with a significantly large cross-sectional area compared with that in an element forming area. Therefore, if a wiring material (for example, copper) 50 is embedded with a metal thickness right for the via hole in the element forming region, a surface level difference occurs in the pad forming region side, as shown in FIG. 16.

Here, a phenomenon that the surface level difference occurs in the pad forming region side is specifically verified. In a plating method, since formation of the Cu film proceeds isotropically, growth occurs from a bottom surface and at the same time growth occurs also from a side surface. For example, if a depth of the via holes in the element forming area and the pad forming area is 800 nm and a width of the via hole in the element forming area is 1.4 μm, the entire via hole is filled when the Cu film accumulating from the both side surfaces becomes 700 nm and more. On the other hand, if the via hole having a larger width than that in the element forming region, for example, width of 5 μm, is formed in the pad forming region, it is not possible to completely fill the via hole both in depth and width, and therefore the surface level difference is formed in this portion.

On the other hand, in the pad forming region according to the first embodiment of the present invention, there are simply formed the via sections having the larger cross-sectional areas than that in the element forming region, and these via sections are disposed in such a manner to be distributed evenly. Consequently, there occurs little difference between the film thicknesses necessary to fill the respective via holes in the element forming region and the pad forming region, and the above problem of the surface level difference can be easily solved. Additionally, when the via sections are disposed in high density practically as in the present embodiment and the embodiments described below, it is preferable to design such that the low dielectric constant insulating films do not become in unstable state after the etching process for forming the via holes.

FIG. 17 is a view for explaining another problem generated in the constitution of the pad forming region according to the above comparative example 1. It is supposed that a Cu film 50 is embedded for example with the film thickness being significantly large when the Cu film 50 is embedded in a via hole 49 and a wiring trench 51 in order to avoid the above problem related to the surface level difference. As a result, in a polishing process by the CMP method, in order to leave the Cu film 50 only in the via hole 49 and the wiring trench 51, it is necessary to polish a significantly large film thickness in accordance with that film thickness. Consequently, an amount of over-polish increases.

Here, the increase in the amount of over-polish in accordance with the film thickness to be polished results from that an object film is polished with a predetermined margin in the polishing process by the CMP method. For example, when the polishing is performed on a layer having a film thickness of for example 1 μm with 10% margin, the polishing is carried out to a position of 100 nm under the film. When the similar polishing is performed on a layer having a film thickness of 1.5 μm, the polishing is carried out to a position of 150 nm under the film. In this way, as the film thickness to be polished becomes larger, the amount of layer under the film polished increases.

In this way, as the film thickness to be polished becomes larger, the amount of over-polish increases. Accompanying to this, an amount of erosion and an amount of dishing also increase, causing a failure in the wiring structure as shown by a broken line in FIG. 18. Here, dishing is a phenomenon caused by a difference in polishing ratios of the Cu film 50 and other films. When the Cu film 50 being a soft material occupies a large area in the surface to be polished as in the present comparison example, a recess is formed particularly noticeably on a surface of the Cu film 50.

Meanwhile, erosion is a phenomenon generated depending on the density of the Cu film 50 in the layer to be polished. When the Cu film 50 is formed in high density on the surface to be polished as in the present comparative example, a barrier metal film and the like surrounding the Cu film 50 are ground to make an organosilicate glass film 52 exposed. Consequently, by a wet process included in the polishing process by the CMP method, the organosilicate glass film 52 become in moist state. If, in this state, a silicon carbide film is formed on a surface of the organosilicate glass film 52 and then degassing treatment and the like are performed, adhesiveness between the organosilicate glass film 52 and the silicon carbide film is decreased, inducing peeling and the like.

Additionally, in a case that the level difference is generated on the surface of the Cu film 50 by the dishing, when an interlayer insulating film with a specific film thickness is formed above the Cu film 50, also on a surface of the interlayer insulating film a level difference which reflects a form of the surface level difference of the Cu film 50 is generated. Consequently, local changes occur in thickness of a photoresist which is further coated thereabove, and a focus margin to the photoresist at a time of exposure is deteriorated.

Further, the following problem is also generated by occurrence of the surface level difference in the interlayer insulating film. For example, when a wiring and the like (Cu film) is further formed on the Cu film 50, there is required a process of patterning the interlayer insulating film formed above the Cu film 50, embedding copper, and polishing a surface thereof by the CMP method. However, since a level difference portion exists on the surface of the interlayer insulating film as described above, after the polishing process copper remains not only in the via or a wiring pattern formed in the interlayer insulating film but also in this level difference portion. As a result, if a plurality of wirings or via sections are formed inside the level difference portion, the wirings are short circuited by copper remaining in the level difference portion and a failure occurs in the wiring structure.

On the other hand, if the level difference on a surface of an upper interlayer insulating film which is generated in accordance with the surface level difference of the Cu film 50 is planarized by the polishing, the film thickness of the interlayer insulating film above the surface level difference portion of the Cu film 50 becomes thicker than those in the other portions, inducing deterioration of an etching margin in a subsequent etching process to the interlayer insulating film.

On the other hand, in the pad forming region according to the first embodiment described above, since there does not occur large difference between the thicknesses necessary to fill up the respective via holes in the element forming region and the pad forming region, the Cu film is not required to be embedded extremely thick in order to secure planarity of a surface. Therefore, it becomes possible to avoid the failure in the wiring structure caused by the dishing and the erosion resulting from an increase in the amount of over-polish.

COMPARATIVE EXAMPLE 2

Here, there is described a constitution example of a pad forming region which can be formed by a single damascene method, as a comparative example 2. FIG. 18 is a view showing the constitution example of the pad forming region according to the comparative example 2. As shown in FIG. 18, in the comparative example 2, there is formed a large via hole with the low dielectric constant insulating film 53 being completely eliminated in a region enclosed by upper wiring (not shown), in order to prevent an internal stress from disproportionately concentrating on a via section 54 side.

Figure 19:
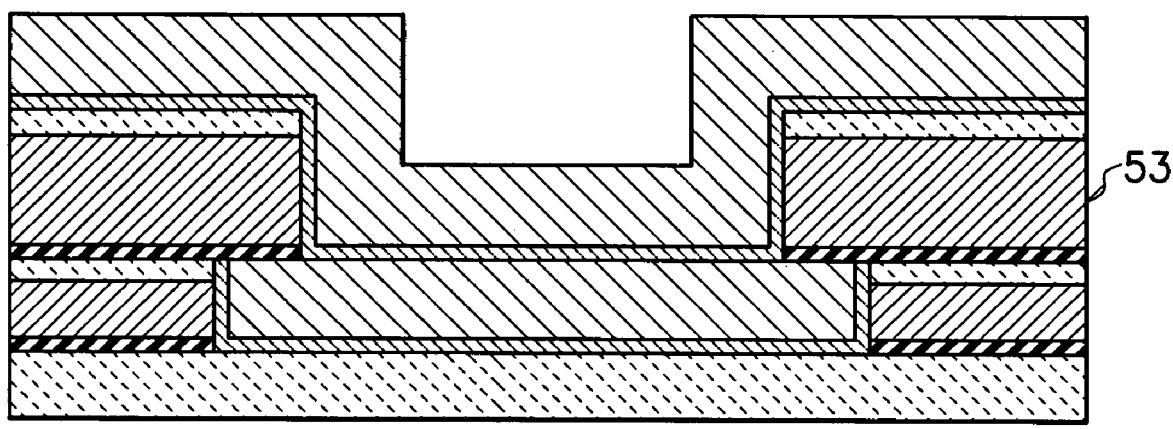
FIG. 19 is a view for explaining a problem generated in the constitution of the pad forming region according to the comparative example 2.

However, in order to form the via section 54, it is necessary to form a via hole with a significantly large capacity compared with that in an element forming region. Therefore, if a wiring material (for example, copper) is embedded with a metal thickness right for the via hole in the element forming region, a level difference occurs on the surface of the pad forming region, as shown in FIG. 19.

On the other hand, in the pad forming region according to the embodiment of the present invention, which is shown in FIG. 14, the via sections with larger cross-sectional areas than that in the element forming area are formed and disposed to be distributed evenly. Therefore, there does not occur large difference between film thicknesses necessary to fill up the respective via holes in the element forming region and the pad forming region, and the problems due to the surface level difference described above can be easily solved.

FIG. 20 is a view for explaining another problem generated in the constitution of the pad forming region according to the above comparative example 2. It is supposed that a Cu film is embedded for example with the film thickness being significantly large when the Cu film is embedded in the via hole to avoid the above problem related to the surface level difference. As a result, in a polishing process by a CMP method for forming the via section 54, it is necessary to polish a significantly large film thickness in accordance with that film thickness. Consequently, an amount of over-polish increases. In this way, in the manufacturing process for the pad forming region according to the comparative example 2, an amount of over-polish increases. Accompanying to this, an amount of erosion and an amount of dishing also increase as shown by a broken line in FIG. 20, causing a failure in a wiring structure.

On the other hand, in the pad constitution shown in FIG. 14, since there does not occur large difference between the thicknesses necessary to fill up the respective via holes in the element forming region and the pad forming region, the Cu film is not required to be embedded extremely thick in order to secure planarity of a surface. Therefore, it becomes possible to avoid the failure in the wiring structure caused by the dishing and the erosion resulting from an increase in the amount of over-polish.

Second Embodiment

Figure 21A:
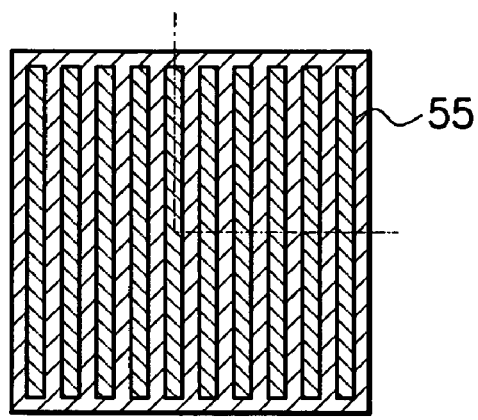
FIG. 21A is a plan view showing a constitution of a Cu multilayer wiring structure in a pad forming region according to a second embodiment of the present invention.
Figure 21B:
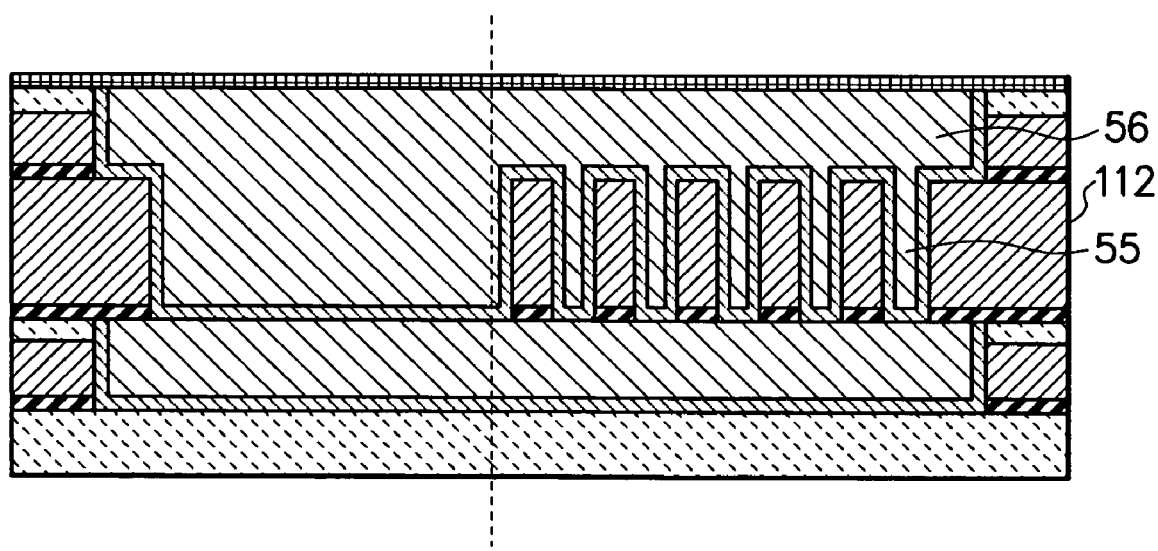
FIG. 21B is a sectional view showing the constitution of the Cu multilayer wiring structure in the pad forming region according to the second embodiment of the present invention.

FIG. 21A and FIG. 21B are a plan view and a sectional view showing a constitution of a Cu multilayer wiring structure in a pad forming region according to a second embodiment of the present invention. Incidentally, a cross-sectional view of FIG. 21B is a view showing a cross-sectional structure of the pad forming region taken along a dashed line in the plan view of FIG. 21A.

The pad forming region according to the second embodiment is formed by a dual damascene method as shown in FIG. 21B, and a plurality of trench shaped via sections 55 are distributed evenly in a region enclosed by a wiring 56, with the via sections being disposed in higher density than that in any of portions of an element forming region.

It is a matter of course that the trench shaped via sections 55 shown in the plan view of FIG. 21A can also be structured by a single damascene method (it should be understood, however, that a cross-sectional structure of a pad forming region in this case is different from that shown in FIG. 21B). In a case that the trench shaped via sections 55 are structured by the dual damascene method, a region where the trench shaped via sections 55 can be structured is limited to inside the region enclosed by the wiring 56. However, in a case of the single damascene method, it is possible to form the trench shaped via sections 55 in arbitrary portions of a low dielectric constant insulating film 112 in the pad forming region.

Further, a direction of disposition of the trench shaped via sections 55 according to the present embodiment is not particularly limited. More specifically, the trench shaped via sections 55 shown in FIG. 21A can be formed in an arbitrary direction.

Third Embodiment

Figure 22A:
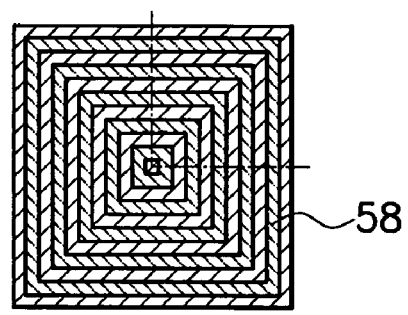
FIG. 22A is a plan view showing a constitution of a Cu multilayer wiring structure in a pad forming region according to a third embodiment of the present invention.
Figure 22B:
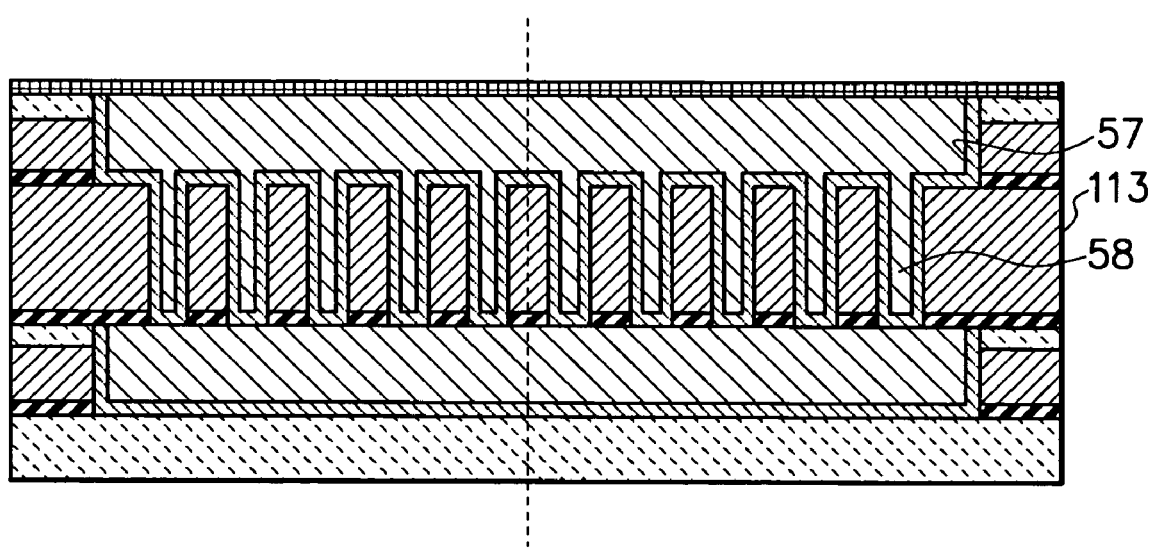
FIG. 22B is a sectional view showing the constitution of the Cu multilayer wiring structure in the pad forming region according to the third embodiment of the present invention.

FIG. 22A and FIG. 22B are a plan view and a sectional view showing a constitution of a Cu multilayer wiring structure in a pad forming region according to a third embodiment of the present invention. Incidentally, FIG. 22B is a view showing a cross-sectional structure of the pad forming region taken along a dashed line shown in the plan view of FIG. 22A.

The pad forming region according to the third embodiment is formed by a dual damascene method as shown in FIG. 22B, and a plurality of concentric trench shaped via sections 58 are distributed evenly in a region enclosed by a wiring 57, with the via sections being disposed in higher density compared with that in an element forming region, as in the first embodiment.

It is a matter of course that the concentric trench shaped via sections 58 shown in the plan view of FIG. 22A can also be structured by a single damascene method (it should be understood, however, that a cross-sectional structure of a pad forming region in this case is different from that shown in FIG. 22B). In a case that the concentric trench shaped via sections 58 are structured by the dual damascene method, a region where the concentric trench shaped via sections 58 can be structured is limited to inside the region enclosed by the wiring 57. However, in a case of the single damascene method, it is possible to form the concentric trench shaped via sections 58 in arbitrary portions of a low dielectric constant insulating film 113 in the pad forming region.

Further, the concentric trench shaped via sections 58 according to the present embodiment is constituted to be surrounded as shown in FIG. 22A. Therefore, if the concentric trench shaped via sections 58 reach a yield stress by an external force applied by wire bonding and the like, and affected thereby, a crack occurs in the low dielectric constant insulating film 113 inside the concentric trench shaped via sections 58, these via sections can realize high functionality as crack stoppers for stemming the crack.

Fourth Embodiment

Figure 23A:
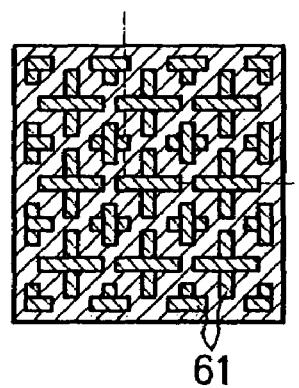
FIG. 23A is a plan view showing a constitution of a Cu multilayer wiring structure in a pad forming region according to a fourth embodiment of the present invention.
Figure 23B:
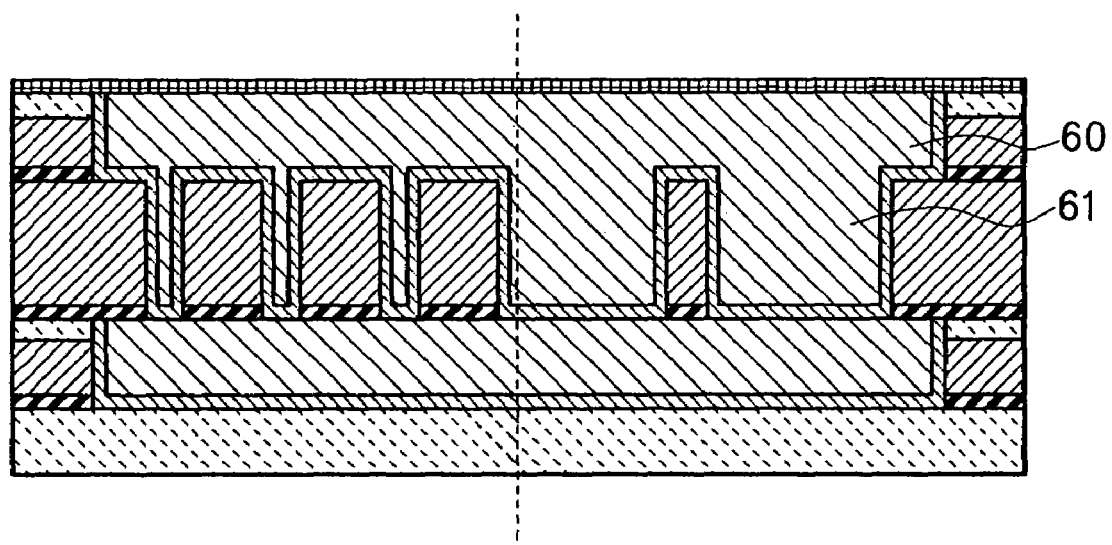
FIG. 23B is a sectional view showing the constitution of the Cu multilayer wiring structure in the pad forming region according to the fourth embodiment of the present invention.

FIG. 23A and FIG. 23B are a plan view and a sectional view showing a constitution of a Cu multilayer wiring structure in a pad forming region according to a fourth embodiment of the present invention. Incidentally, FIG. 23B is a view showing a cross-sectional structure of the pad forming region taken along a dashed line shown in the plan view of FIG. 23A.

The pad forming region according to the fourth embodiment is formed by a dual damascene method as shown in FIG. 23B, and a plurality of trench shaped via sections 61 having crossed line shapes, T-shapes, and L-shapes in combination are distributed evenly in a region enclosed by a wiring 60, with the via sections 61 being disposed in higher density compared with that in an element forming region, as in the first embodiment.

It is a matter of course that the trench shaped via sections 61 shown in the plan view of FIG. 23A can also be structured by a single damascene method (it should be understood, however, that a cross-sectional structure of a pad forming region in this case is different from that shown in FIG. 23B). In a case that the trench shaped via sections 61 are structured by the dual damascene method, a region where the trench shaped via sections 61 can be structured is limited to inside the region enclosed by the wiring 60. However, in a case of the single damascene method, it is possible to form the trench shaped via sections 61 in arbitrary portions of a low dielectric constant insulating film in the pad forming region.

Fifth Embodiment

Figure 24A:
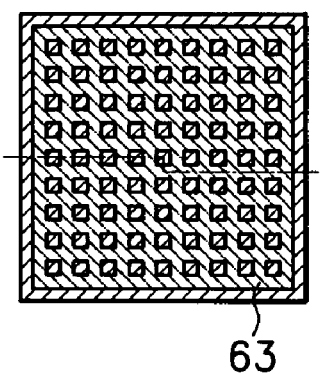
FIG. 24A is a plan view showing a constitution of a Cu multilayer wiring structure in a pad forming region according to a fifth embodiment of the present invention.
Figure 24B:
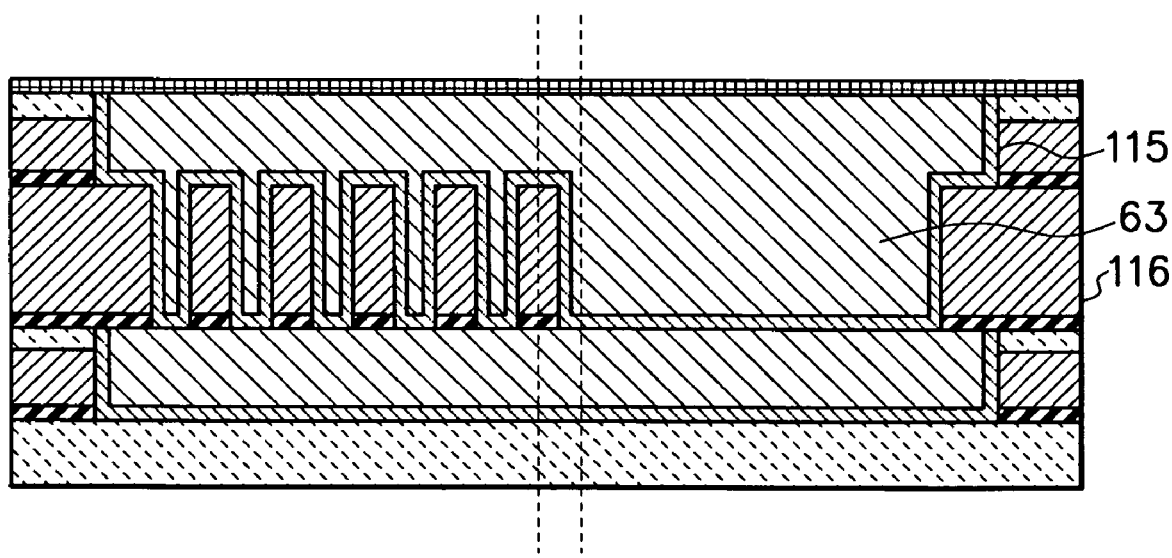
FIG. 24B is a sectional view showing the constitution of the Cu multilayer wiring structure in the pad forming region according to the fifth embodiment of the present invention.

FIG. 24A and FIG. 24B are a plan view and a sectional view showing a constitution of a Cu multilayer wiring structure in a pad forming region according to a fifth embodiment of the present invention. Incidentally, FIG. 24B is a view showing a cross-sectional structure of the pad forming region taken along a dashed line shown in the plan view of FIG. 24A.

In the pad forming region according to the fifth embodiment, a trench shaped via section 63 having a surrounded lattice shape is formed by a dual damascene method as shown in FIG. 24B, with the via section being disposed in higher density compared with that in an element forming region, as in the first embodiment.

It is a matter of course that the trench shaped via section 63 shown in the plan view of FIG. 24A can also be structured by a single damascene method (it should be understood, however, that a cross-sectional structure of a pad forming region in this case is different from that shown in FIG. 24B). In a case that the trench shaped via section 63 is structured by the dual damascene method, a region where the trench shaped via section 63 can be structured is limited to inside the region enclosed by the wiring 115. However, in a case of the single damascene method, it is possible to form the trench shaped via section 63 in an arbitrary portion of a low dielectric constant insulating film 116 in the pad forming region.

Further, the trench shaped via section 63 according to the present embodiment is constituted to be surrounded as shown in FIG. 24A. Therefore, if the trench shaped via section 63 reaches a yield stress by an external force applied by wire bonding and the like, and affected thereby, a crack occurs in the low dielectric constant insulating film 116 inside the trench shaped via section 63, this via section can realize high functionality as a crack stopper for stemming the crack.

Sixth Embodiment

FIG. 25A and FIG. 25B are a plan view and a sectional view showing a constitution example of a Cu multilayer wiring structure in a pad forming region according to a sixth embodiment of the present invention. Incidentally, FIG. 25B is a view showing a cross-sectional structure of the pad forming region taken along a dashed line shown in the plan view of FIG. 25A.

In the pad forming region according to the sixth embodiment, a lattice shaped wiring 65 is formed in an electrode pad, as shown in FIG. 25B. Hereby, an area and a density of a Cu film in a surface to be polished at a time of a CMP are decreased, and an amount of dishing and an amount of erosion generated at this time can be reduced.

Additionally, the pad forming region according to the present embodiment has, under the electrode pad, a constitution of via sections similar to that in the first embodiment, so that it is avoided that an internal stress disproportionately concentrates on via sections 66.

Further, it is a matter of course that the via sections 66 shown in the plan view of FIG. 25A can also be structured by a single damascene method (it should be understood, however, that a cross-sectional structure of a pad forming region is different from that shown in FIG. 25B). In a case that the via sections 66 are structured by the dual damascene method, a region where the via sections 66 can be formed is limited to inside the region enclosed by the wirings 65. However, in a case of the single damascene method, it is possible to form the via sections 66 in arbitrary portions of a low dielectric constant insulating film 117 in the pad forming region.

Seventh Embodiment

Figure 26A:
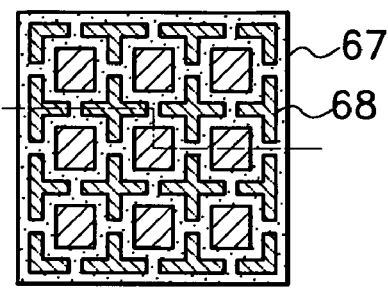
FIG. 26A is a plan view showing a constitution of a Cu multilayer wiring structure in a pad forming region according to a seventh embodiment of the present invention.
Figure 26B:
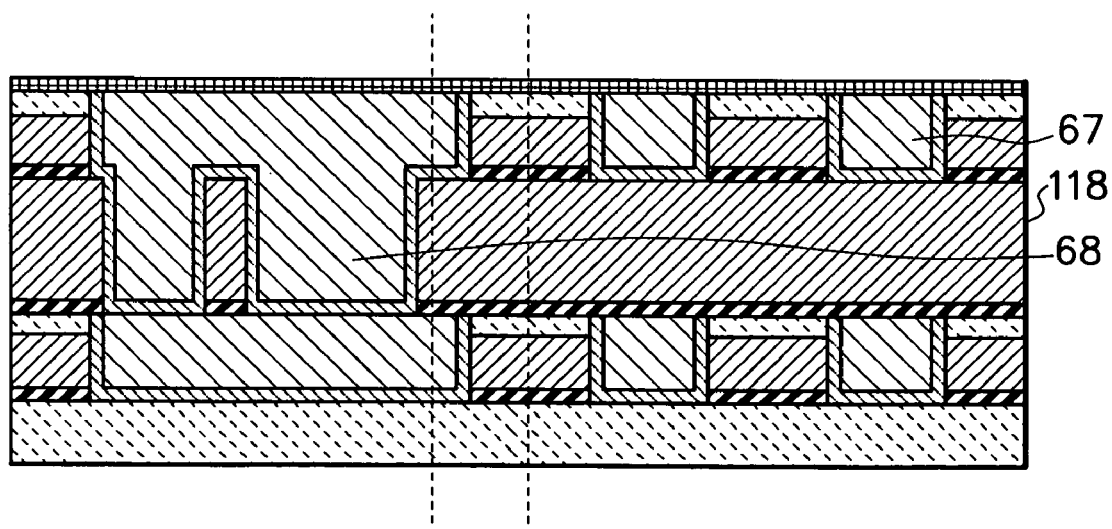
FIG. 26B is a sectional view showing the constitution of the Cu multilayer wiring structure in the pad forming region according to the seventh embodiment of the present invention.

FIG. 26A and FIG. 26B are a plan view and a sectional view showing a constitution example of a Cu multilayer wiring structure in a pad forming region according to a seventh embodiment of the present invention. Incidentally, FIG. 26B is a view showing a cross-sectional structure of the pad forming region taken along a dashed line shown in the plan view of FIG. 26A.

In the pad forming region according to the seventh embodiment, a lattice shaped wiring 67 is formed in an electrode pad, as in the above sixth embodiment. Hereby, an area and a density of a Cu film in a surface to be polished at a time of a CMP are decreased, and an amount of dishing and an amount of erosion generated at this time can be reduced.

Additionally, the pad forming region according to the present embodiment has a via constitution of higher density than that of an element forming region as in the first embodiment, with a plurality of via sections 68 of a combination of trench shaped via sections having crossed line shapes, T-shapes, and L-shapes being formed, to prevent an internal stress from disproportionately concentrating on the via sections 68.

Further, it is a matter of course that the via sections 68 shown in the plan view of FIG. 26A can also be structured by a single damascene method (it should be understood, however, that a cross-sectional structure of a pad forming region in this case is different from that shown in FIG. 26B). In a case that the via sections 68 are structured by the dual damascene method, a region where the via sections 68 can be formed is limited to inside the region enclosed by the wirings 67. However, in a case of the single damascene method, it is possible to form the via sections 68 in arbitrary portions of a low dielectric constant insulating film 118 in the pad forming region.

Eighth Embodiment

Figure 27:
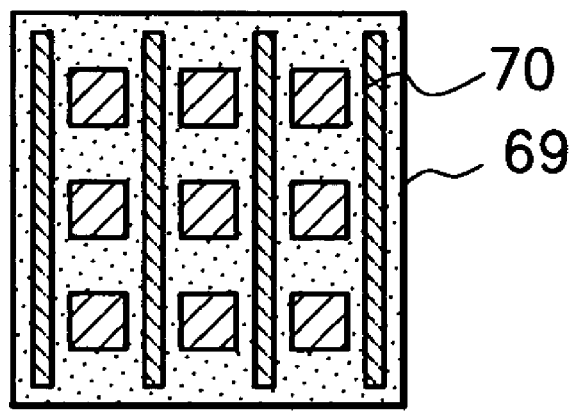
FIG. 27 is a plan view showing a constitution of a Cu multilayer wiring structure in a pad forming region according to an eighth embodiment of the present invention.

FIG. 27 is a plan view showing a constitution of a Cu multilayer wiring structure according to an eighth embodiment of the present invention. A pad forming region according to the eighth embodiment has a via constitution with higher density than that in an element forming region as in the first embodiment, with a plurality of trench shaped via sections 70 being formed in one direction in a region enclosed by a lattice shaped wiring 69. Additionally, in an electrode pad in the pad forming region according to the eighth embodiment, a lattice shaped wiring is formed as in the above sixth embodiment. Hereby, an area and a density of a Cu film in a surface to be polished at a time of a CMP are decreased, and an amount of dishing and an amount of erosion generated at this time can be reduced.

Ninth Embodiment

Figure 28:
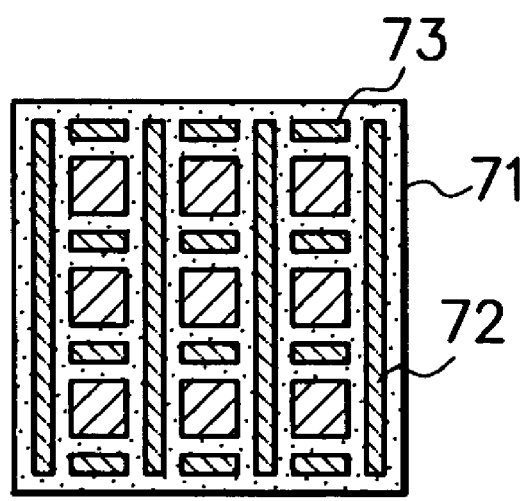
FIG. 28 is a plan view showing a constitution of a Cu multilayer wiring structure in a pad forming region according to a ninth embodiment of the present invention.

FIG. 28 is a plan view showing a constitution of a Cu multilayer wiring structure in a pad forming region according to a ninth embodiment of the present invention. The pad forming region according to the ninth embodiment has a via constitution with higher density than that in an element forming region as in the first embodiment, with trench shaped via sections 72 extending in one direction in a region enclosed by a lattice shaped wiring 71 and trench shaped via sections 73 extending between the trench shaped via sections 72 in a vertical direction thereof being formed. Additionally, in an electrode pad in the pad forming region according to the ninth embodiment, the lattice shaped wiring 71 is formed as in the above sixth embodiment. Hereby, an area and a density of a Cu film in a surface to be polished at a time of a CMP are decreased, and an amount of dishing and an amount of erosion generated at this time can be reduced.

Tenth Embodiment

FIG. 29A and FIG. 29B are a plan view and a sectional view showing a constitution example of a Cu multilayer wiring structure in a pad forming region according to a tenth embodiment of the present invention. Incidentally, FIG. 29B is a view showing a cross-sectional structure of the pad forming region taken along a dashed line shown in the plan view of FIG. 29A.

Also in the pad forming region according to the tenth embodiment, a lattice shaped wiring 74 is formed in an electrode pad as in the above sixth embodiment, and an area and a density of a Cu film in a surface to be polished at a time of a CMP are decreased, and an amount of dishing and an amount of erosion generated at this time can be reduced.

As shown in FIG. 29B, the pad forming region of the present embodiment is formed by a dual damascene method and has a via constitution with higher density than that in an element forming region as in the first embodiment, with a lattice shaped via section 75 having a shape similar to that of the wiring 74 being formed. Additionally, the lattice shaped via section 75 according to the present embodiment is constituted to be surrounded as shown in FIG. 29A. Therefore, if the lattice shaped via section 75 reaches a yield stress by an external force applied by wire bonding and the like, and affected thereby, a crack occurs in the low dielectric constant insulating film 119 inside the lattice shaped via section 75, this via section can realize high functionality as a crack stopper for stemming the crack.

Eleventh Embodiment

Figure 30A:
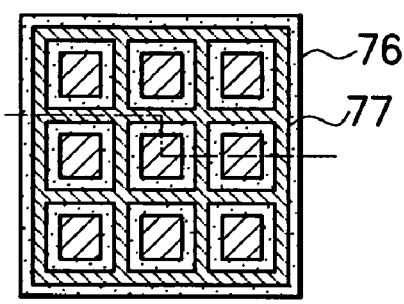
FIG. 30A is a plan view showing a constitution of a Cu multilayer wiring structure in a pad forming region according to an eleventh embodiment of the present invention.
Figure 30B:
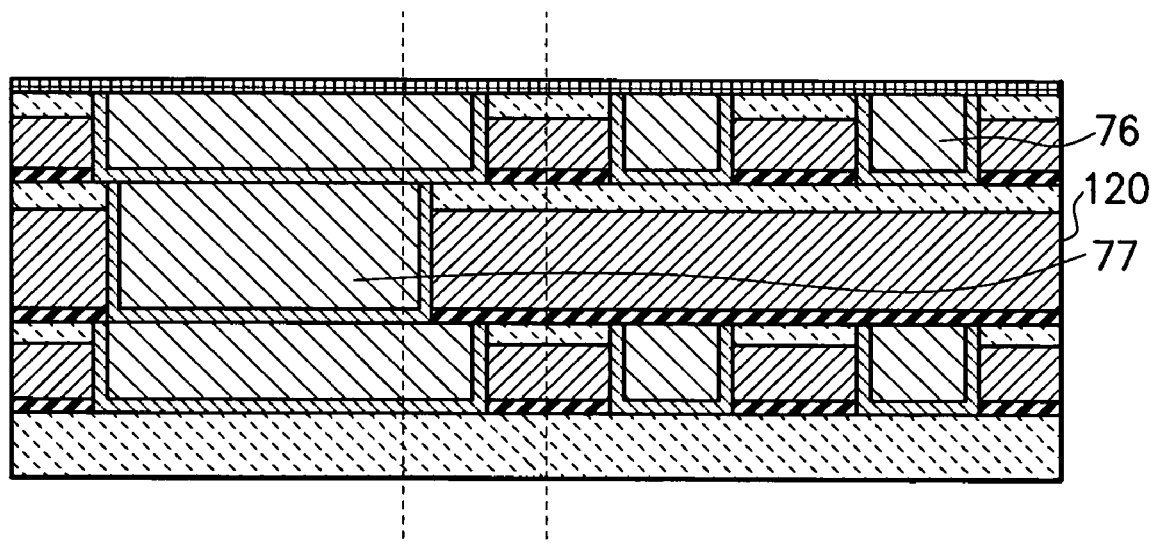
FIG. 30B is a sectional view showing the constitution of the Cu multilayer wiring structure in the pad forming region according to the eleventh embodiment of the present invention.

FIG. 30A and FIG. 30B are a plan view and a sectional view showing a constitution example of a Cu multilayer wiring structure according to an eleventh embodiment of the present invention. Incidentally, FIG. 30B is a view showing a cross-sectional structure of a pad forming region shown in the plan view of FIG. 30A.

Also in the pad forming region according to the eleventh embodiment, a lattice shaped wiring 76 is formed in an electrode pad as in the above sixth embodiment. Hereby, an area and a density of a Cu film in a surface to be polished at a time of a CMP are decreased, and an amount of dishing and an amount of erosion generated at this time can be reduced.

As shown in FIG. 30B, the pad forming region according to the present embodiment is formed by a single damascene method, and has a via constitution with higher density than that in an element forming region as in the first embodiment, with a lattice shaped via section 77 having a shape similar to that of the wiring 76 being formed. Additionally, the lattice shaped via section 77 according to the present embodiment is constituted to be surrounded as shown in FIG. 30B. Therefore, if the lattice shaped via section 77 reaches a yield stress by an external force applied by wire bonding and the like, and affected thereby, a crack occurs in the low dielectric constant insulating film 120 inside the lattice shaped via section 77, this via section can realize high functionality as a crack stopper for stemming the crack.

Incidentally, though not being referred to in the descriptions of the above second, the third, the seventh, the eighth, and the ninth embodiments, it is a matter of course that, also in these embodiments, by the via sections being made to be trench shaped these via sections can function as crack stoppers depending on directions of movement of the cracks.

Figure 31A:
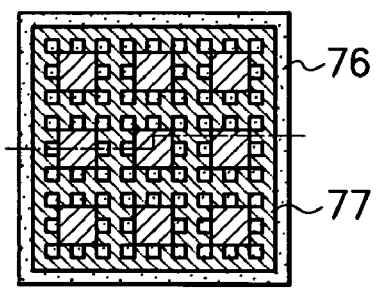
FIG. 31A is a plan view showing another constitution example of the pad forming region according to the eleventh embodiment of the present invention.
Figure 31B:
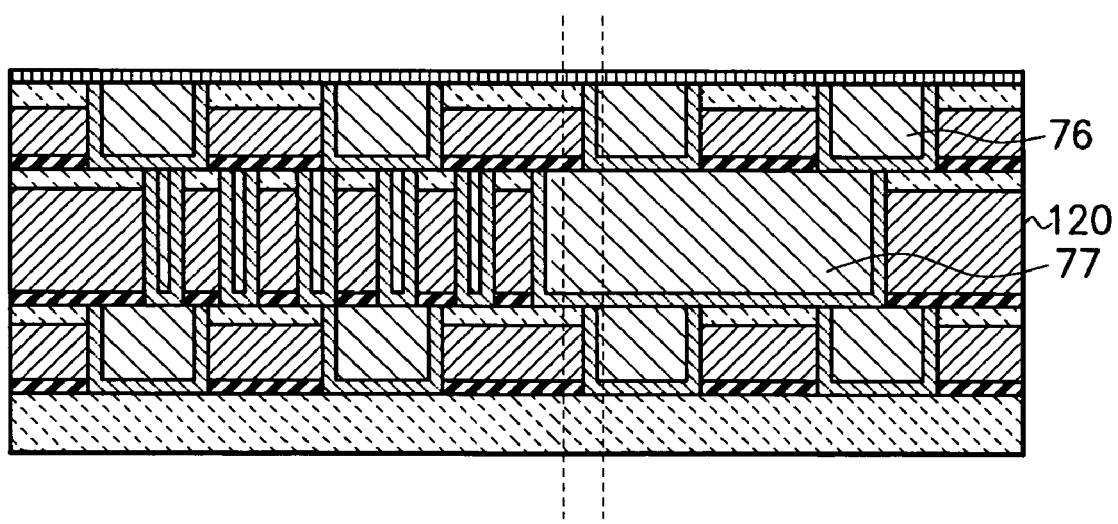
FIG. 31B is a sectional view showing the another constitution example of the pad forming region according to the eleventh embodiment of the present invention.

Further, in the present embodiment, though there is shown an example in which the lattice shaped via section 77 is formed in a region enclosed by the lattice shaped wiring 76, the via section can be formed in an arbitrary portion of the low dielectric constant insulating film 120 in the pad forming region, since the pad forming region according to the present embodiment is formed by the single damascene method. The concrete example is shown in FIG. 31A and FIG. 31B. Incidentally, a sectional view of FIG. 31B is a view showing a cross-sectional structure of the pad forming region shown in a plan view of the FIG. 31A, and the same reference numerals are used to designate elements corresponding to the respective constitutions in FIG. 30A and FIG. 30B.

Twelfth Embodiment

FIG. 32 is a sectional view showing a constitution of a Cu multilayer wiring structure in an element forming region and a pad forming region according to a twelfth embodiment of the present invention. The Cu multilayer wiring structure according to the present embodiment is formed by a dual damascene method as shown in FIG. 32, and includes a wiring structure composed of a plurality of levels of wirings 78 and a plurality of levels of via sections 79.

As described above, the Cu multilayer wiring structure according to the present embodiment has the constitution to disperse internal stresses applied to the respective Cu films, by including the pluralities of levels of wirings 78 and via sections 79 respectively so that an occupied density of Cu films in the pad forming region is increased. Further, the Cu multilayer wiring structure according to the present embodiment has the constitution in which a corner of the pad forming region is penetrated by the pluralities of levels of wirings 78 and the via sections 79 and the wiring 79 of the bottom layer is insulated from a silicon substrate 84 by a silicon oxide film 80. Therefore, if shapes of the via sections 79 are trench shaped, the via sections 79 function as crack stoppers for preventing progress of a crack generated in the pad forming region.

Thirteenth Embodiment

Figure 33:
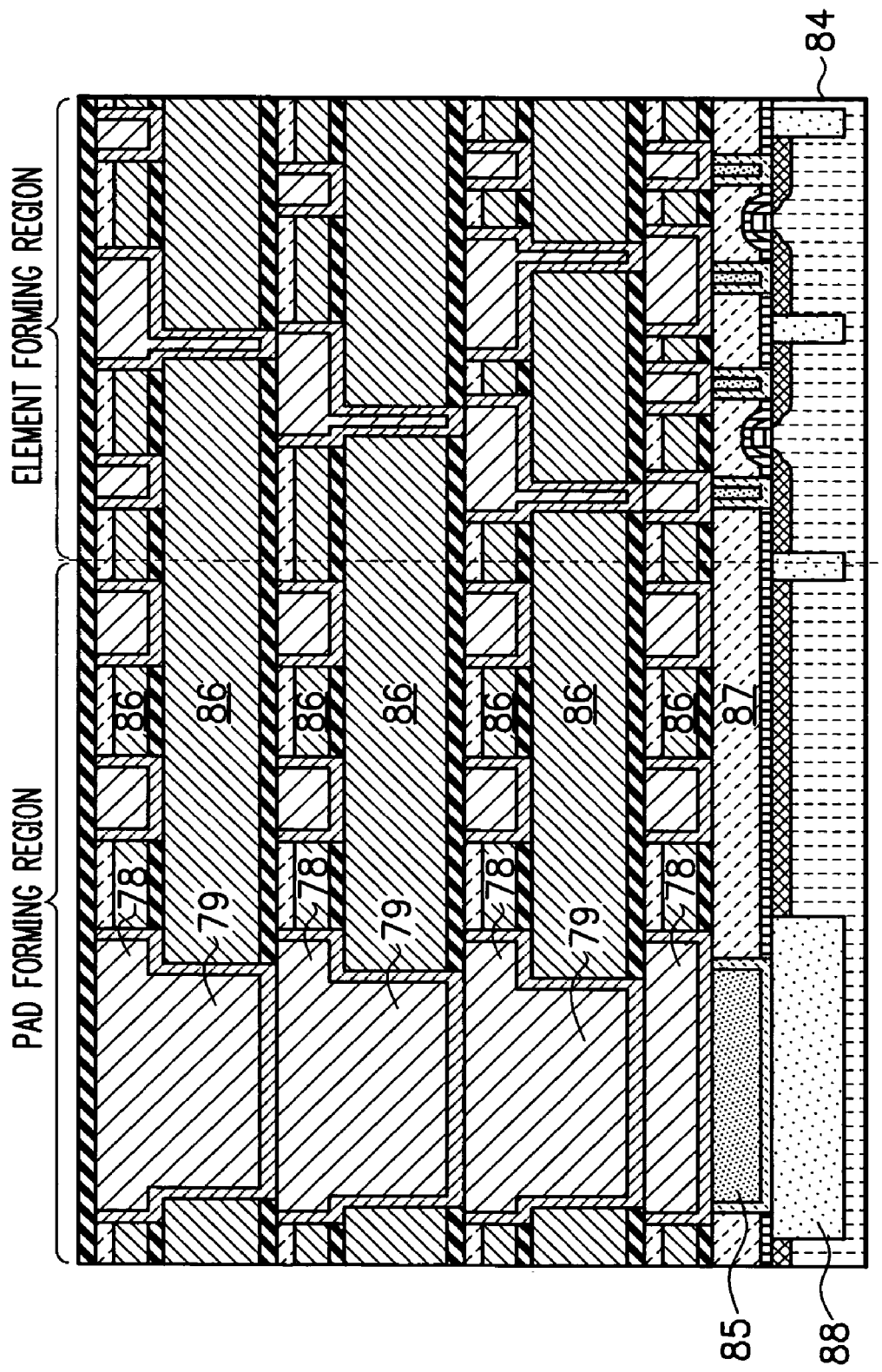
FIG. 33 is a sectional view showing a constitution of a Cu multilayer wiring structure in an element forming region and a pad forming region according to a thirteenth embodiment of the present invention.

FIG. 33 is a sectional view showing a constitution of a Cu multilayer wiring structure in an element forming region and a pad forming region according to a thirteenth embodiment of the present invention. The Cu multilayer wiring structure according to the present embodiment includes a wiring structure composed of a plurality of levels of wirings 78 and a plurality of levels of via sections 79 as in the Cu multilayer wiring structure according to the above twelfth embodiment, as well as includes a tungsten plug 85 under the wiring 78 of a bottom layer, with a corner of the pad forming region being penetrated by the plurality of levels of wirings 78, the plurality of levels of via sections 79, and the tungsten plug 85. Therefore, the Cu multilayer wiring structure according to the present embodiment is capable of preventing progress of a crack generated in low dielectric constant insulating films 86 and a silicon oxide film 87 in the pad forming region.

Incidentally, in the present embodiment, the tungsten plug 85 is formed also in the pad forming region as described above, and in order to insulate this tungsten plug 85 and a silicon substrate 84, an element isolation structure 88 is formed in a part of a region of the silicon substrate which encloses the tungsten plug 85 down below.

Fourteenth Embodiment

Figure 34:
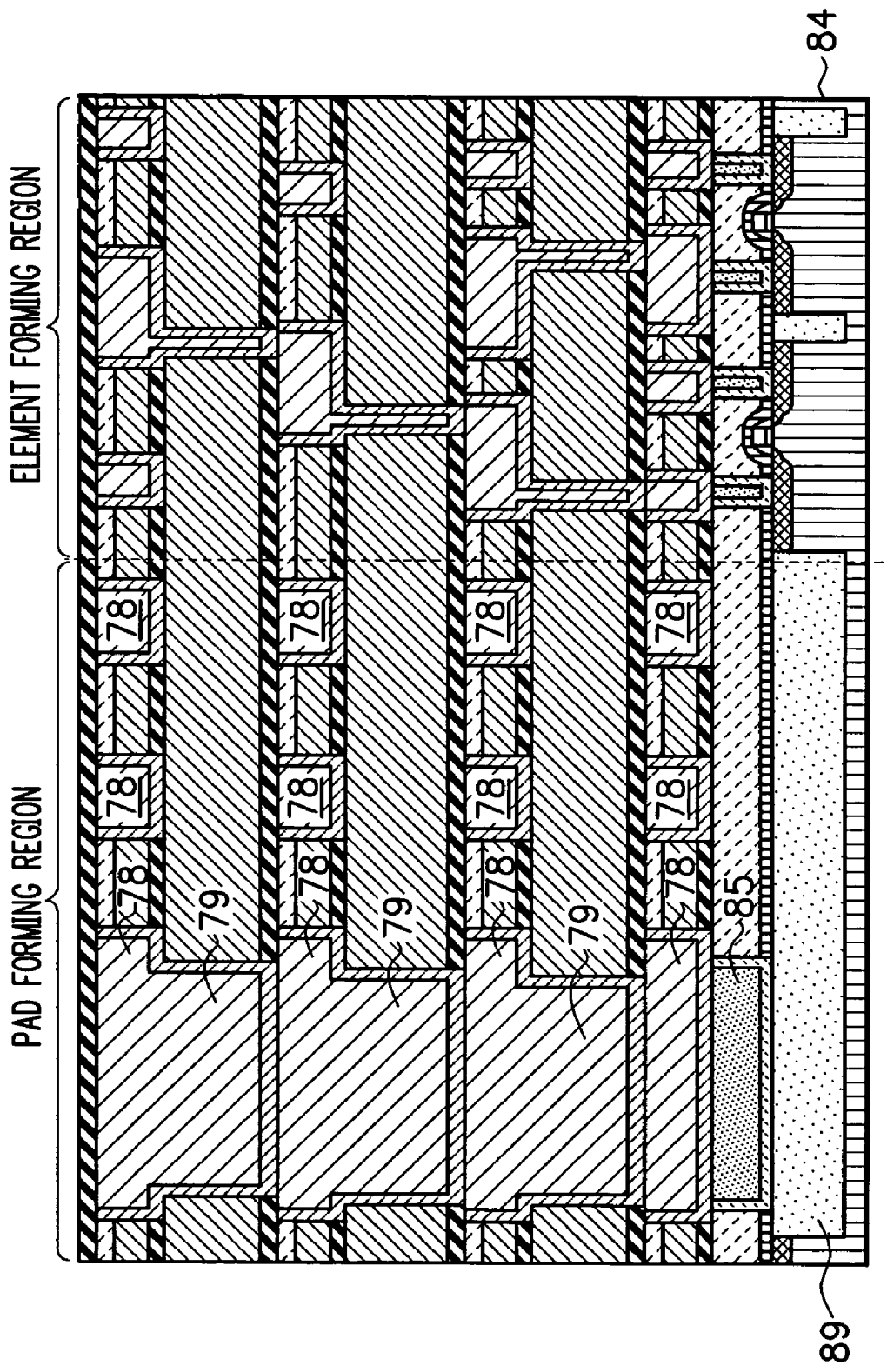
FIG. 34 is a sectional view showing a constitution of a Cu multilayer wiring structure in an element forming region and a pad forming region according to a fourteenth embodiment of the present invention.

FIG. 34 is a sectional view showing a constitution of a Cu multilayer wiring structure in an element forming region and a pad forming region according to a fourteenth embodiment of the present invention. The Cu multilayer structure according to the present embodiment is formed to be a constitution in which a plurality of levels of wirings 78, a plurality of levels of via sections 79, and a tungsten plug 85 under the wiring 78 of a bottom layer penetrate a corner of the pad forming region, as in the Cu multilayer wiring structure according to the above thirteenth embodiment.

Also in the Cu multilayer wiring structure according to the present embodiment, as in the above thirteenth embodiment, an element isolation structure 89 is formed in a silicon substrate 84 by an STI method in order to insulate the tungsten plug 85 and the silicon substrate 84. The present embodiment is constitutionally different from the above thirteenth embodiment in a size of a region where the element isolation structure 89 is formed. In the present embodiment, the element isolation structure 89 is formed on substantially an entire surface of the silicon substrate 84 in the pad forming region to further increase a distance between the silicon substrate 84 and the wiring structure as a whole in the pad forming region by this element isolation structure 89, so that the constitution enables reducing a stray capacitance between the wiring structure and the silicon substrate 84.

Fifteenth Embodiment

Figure 35:
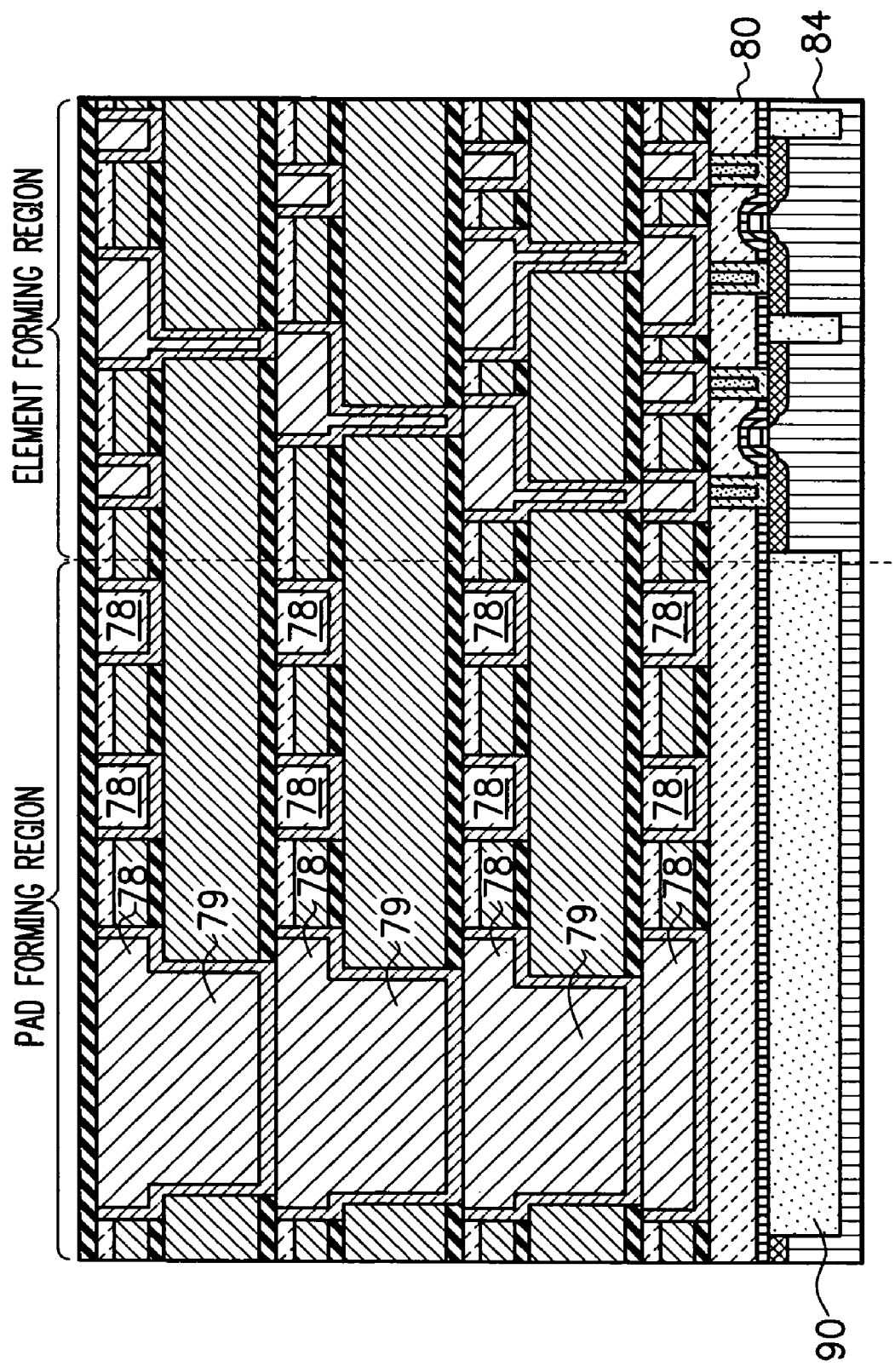
FIG. 35 is a sectional view showing a constitution of a Cu multilayer wiring structure in an element forming region and a pad forming region according to a fifteenth embodiment of the present invention.

FIG. 35 is a sectional view showing a constitution of a Cu multilayer wiring structure in an element forming region and a pad forming region according to a fifteenth embodiment of the present invention. As the constitution of the Cu multilayer wiring structure according to the above fourteenth embodiment, there is described the constitution where the stray capacitance between the silicon substrate and the wiring structure as a whole of the tungsten plug 85, the wirings 78, and the via sections 79. This constitution is applicable to the above twelfth embodiment, and the fifteenth embodiment of the present invention is an example in which the above-described constitution for reducing the stray capacitance is added to the Cu multilayer wiring structure according to the above twelfth embodiment.

In the Cu multilayer wiring structure according to the fifteenth embodiment of the present invention, as shown in FIG. 35, an element isolation structure 90 is formed on an entire surface of a silicon substrate 84 in the pad forming region to further increase a distance between the silicon substrate 84 in the pad forming region and a wiring structure formed thereabove (here, the wiring structure composed of the wirings 78 and the via sections 79), so that the stray capacitance between the wiring structure and the silicon substrate 84 can be reduced.

Sixteenth Embodiment

Figure 36:
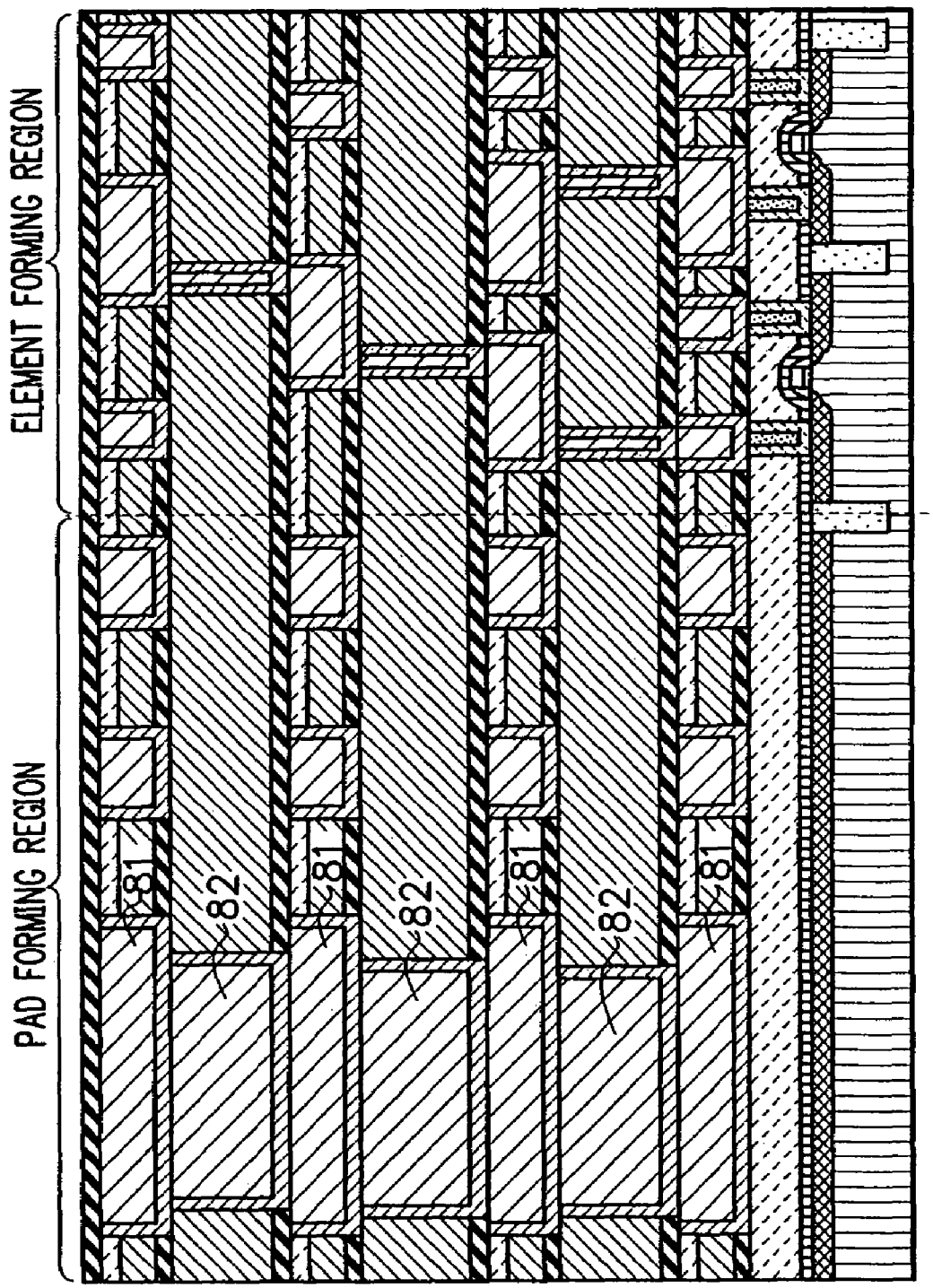
FIG. 36 is a sectional view showing a constitution of a Cu multilayer wiring structure in an element forming region and a pad forming region according to a sixteenth embodiment of the present invention.

FIG. 36 is a sectional view showing a constitution of a Cu multilayer wiring structure in an element forming region and a pad forming region according to a sixteenth embodiment of the present invention. The Cu multilayer wiring structure according to the present embodiment is formed by a single damascene method as shown in FIG. 36, and includes a wiring structure composed of a plurality of levels of wirings 81 and a plurality of levels of via sections 82.

The present embodiment, as shown in FIG. 36, is the Cu multilayer wiring structure having a similar structure to that in the twelfth embodiment. In manufacturing processes thereof, the present embodiment and the twelfth embodiment are different in that the twelfth embodiment adopts the dual damascene method while the present embodiment adopts the single damascene method.

Since the Cu multilayer wiring structure according to the present embodiment includes the similar constitution to the Cu multilayer wiring structure according to the twelfth embodiment, operation and effect based on the constitution is similar to that of the twelfth embodiment. More specifically, the Cu multilayer wiring structure according to the present embodiment includes pluralities of levels of wirings 81 and the via sections 82 respectively, to increase an occupied density of Cu films in the pad forming region so that internal stresses applied to the respective Cu films can be dispersed.

Additionally, since the Cu multilayer wiring structure according to the present embodiment has a constitution in which a corner of the pad forming region is penetrated by the pluralities of levels of wirings 81 and the via sections 82, the via section 82 can prevent progress of a crack generated in the pad forming region by making shapes of the via sections 82 to be trench shaped.

In the above, the Cu multilayer wiring structure corresponding to the twelfth embodiment formed by the single damascene method is described. It is a matter of course that the thirteenth to fifteenth embodiments can be formed similarly by the single damascene method and similar operations and effects to those in the thirteenth to fifteenth embodiments are obtained.

The technical idea of the present invention is not limited to the above-described semiconductor devices or methods for manufacturing the same, but a designing method for designing the semiconductor device to implement the method for manufacturing is also included in a range of the present invention. By way of example, it is also included in the range of the present invention to carry out designing in such a manner that the via section in the pad forming region is disposed in higher density than the via section in any of portions of the element forming region when the via sections are formed respectively in the element forming region and the pad forming region in the low dielectric constant insulating film being the interlayer insulating film.

INDUSTRIAL APPLICABILITY

According to the present invention, since a first connection hole in a pad region is disposed in higher density than a second connection hole in any of portions of an element region, when an internal stress occurs, it is possible to prevent the stress from disproportionately concentrating on the first connection hole and to avoid deterioration of a function of a wiring caused thereby.

TABLE 1

| | Young's Modulus (GPa) | Poisson's Ratio | Thermal Expansion Coefficient ($\times 10^{-6}$) | Hardness (GPa) |
|---|---|---|---|---|
| Si | 130 | 0.28 | 3.0 | |
| Cu | 128 | 0.33 | 16.6 | |
| $Si_3N_4$ | 150 | 0.25 | 1.0 | |
| $SiO_2$ (Fused silica) | 70 | 0.17 | 0.6 | 6.3 |
| SiLK | 2.5 | 0.34 | 66.0 | 0.38 |

What is claimed is:

1. A semiconductor device, comprising:
   an element region including a wiring structure in a low dielectric constant insulating film; and
   a pad region electrically connecting said element region and the outside, in which the low dielectric constant insulating film is formed in association with in said element region,
   wherein an occupied density of a plurality of first connection holes formed in the low dielectric constant insulating film in said pad region is higher than an occupied density of a second connection hole in any of portions of the wiring structure in said element region,
   wherein a Young's modulus of the low dielectric constant insulating film is 20 GPa and below,
   wherein the plurality of first connection holes are formed in such a manner to be distributed substantially evenly in said pad region, and
   wherein a lattice shaped wiring electrically connecting said element region and the outside is formed above the low dielectric constant insulating film in said pad region.

2. The semiconductor device according to claim 1, wherein the number of the first connection holes is larger than the number of the second connection holes in a given area.

3. The semiconductor device according to claim 1, wherein the first connection hole is formed in an arbitrary portion of the low dielectric constant insulating film.

4. A semiconductor device, comprising:
an element region including a wiring structure in a low dielectric constant insulating film; and
a pad region electrically connecting said element region and the outside, in which the low dielectric constant insulating film is formed in association with in said element region,
wherein an occupied density of a first connection hole formed in the low dielectric constant insulating film in said pad region is higher than an occupied density of a second connection hole in any of portions of the wiring structure in said element region,
wherein a Young's modulus of the low dielectric constant insulating film is 20 GPa and below, and
wherein the first connection hole is formed of a plurality of concentric ring shaped connection holes, and all of the plurality of concentric ring shaped connection holes is unified.

5. The semiconductor device according to claim 4, wherein a wiring electrically connecting said element region and the outside is formed above the low dielectric constant insulating film in said pad region.

6. The semiconductor device according to claim 5, wherein the first connection hole is enclosed by and directly connected to the wiring.

7. The semiconductor device according to claim 6, wherein the first connection hole is formed to be trench shaped.

8. The semiconductor device according to claim 6, wherein the plurality of first connection holes is placed to be lattice shaped.

9. The semiconductor device according to claim 5, wherein the first connection hole is formed in an arbitrary portion of the low dielectric constant insulating film.

10. The semiconductor device according to claim 4, wherein a lattice shaped wiring electrically connecting said element region and the outside is formed above the low dielectric constant insulating film in said pad region.

11. The semiconductor device according to claim 10, wherein the first connection hole is enclosed by and directly connected to the lattice shaped wiring.

12. The semiconductor device according to claim 4, wherein said pad region includes a multilayer wiring structure formed in association with in said element region.

13. The semiconductor device according to claim 12, wherein the multilayer wiring structure in said pad region includes a wiring structure penetrating a corner of said pad region.

14. The semiconductor device according to claim 4, wherein the first connection hole has a larger cross-sectional area than the second connection hole.

15. The semiconductor device according to claim 4, wherein the number of the first connection holes is larger than the number of the second connection holes in a given area.

16. A semiconductor device, comprising:
an element region including a wiring structure in a low dielectric constant insulating film; and
a pad region electrically connecting said element region and the outside, in which the low dielectric constant insulating film is formed in association with in said element region,
wherein an occupied density of a plurality of first connection holes formed in the low dielectric constant insulating film in said pad region is higher than an occupied density of a second connection hole in any of portions of the wiring structure in said element region,
wherein a Young's modulus of the low dielectric constant insulating film is 20 GPa and below,
wherein the plurality of first connection holes are formed in such a manner to be distributed substantially evenly in said pad region,
wherein a lattice shaped wiring electrically connecting said element region and the outside is formed above the low dielectric constant insulating film in said pad region, and
wherein the first connection hole is enclosed by and directly connected to the lattice shaped wiring.

17. The semiconductor device according to claim 16, wherein the first connection hole is formed in an arbitrary portion of the low dielectric constant insulating film.

18. The semiconductor device according to claim 16, wherein the number of the first connection holes is larger than the number of the second connection holes in a given area.

19. A semiconductor device, comprising:
an element region including a wiring structure in a low dielectric constant insulating film; and
a pad region electrically connecting said element region and the outside, in which the low dielectric constant insulating film is formed in association with in said element region,
wherein an occupied density of a plurality of first connection holes formed in the low dielectric constant insulating film in said pad region is higher than an occupied density of a second connection hole in any of portions of the wiring structure in said element region,
wherein a Young's modulus of the low dielectric constant insulating film is 20 GPa and below,
wherein the plurality of first connection holes are formed in such a manner to be distributed substantially evenly in said pad region,
wherein a wiring electrically connecting said element region and the outside is formed above the low dielectric constant insulating film in said pad region,
wherein the first connection hole is enclosed by and directly connected to the wiring, and
wherein the plurality of first connection holes is placed to be lattice shaped.

20. The semiconductor device according to claim 19, wherein the first connection hole is formed in an arbitrary portion of the low dielectric constant insulating film.

21. The semiconductor device according to claim 19, wherein the number of the first connection holes is larger than the number of the second connection holes in a given area.

* * * * *